US012672484B2

(12) United States Patent
Despesse et al.

(10) Patent No.: US 12,672,484 B2
(45) Date of Patent: Jun. 30, 2026

(54) ELECTRICAL ENERGY CONVERTER WITH AT LEAST ONE PAIR OF PIEZOELECTRIC ASSEMBLIES AND AT LEAST ONE COMPLEMENTARY SWITCH FOR DIRECT CONNECTION BETWEEN THEM, CONVERSION SYSTEM AND ASSOCIATED CONTROL METHOD

(71) Applicant: Commissariat à l'énergie atomique et aux énergies alternatives, Paris (FR)

(72) Inventors: Ghislain Despesse, Grenoble Cedex (FR); Mustapha Touhami, Grenoble Cedex (FR); Valentin Breton, Grenoble Cedex (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 877 days.

(21) Appl. No.: 18/061,684

(22) Filed: Dec. 5, 2022

(65) Prior Publication Data

US 2023/0180616 A1     Jun. 8, 2023

(30) Foreign Application Priority Data

Dec. 3, 2021    (FR) ..................................... 21 12933

(51) Int. Cl.
        *H10N 30/40*        (2023.01)
        *H02M 3/155*        (2006.01)
        *H10N 30/80*        (2023.01)
(52) U.S. Cl.
        CPC ............ *H10N 30/40* (2023.02); *H02M 3/155* (2013.01); *H10N 30/804* (2023.02)

(58) Field of Classification Search
        CPC ... H10N 30/40; H10N 30/804; H02M 1/0058; H02M 3/155; H02M 3/33573;
        (Continued)

(56) References Cited

U.S. PATENT DOCUMENTS

| | | | | |
|---|---|---|---|---|
| 6,016,052 A * | 1/2000 | Vaughn | .............. | H05B 41/2822 |
| | | | | 310/318 |
| 7,012,578 B2 * | 3/2006 | Nakatsuka | ......... | H05B 41/2827 |
| | | | | 323/361 |

(Continued)

OTHER PUBLICATIONS

French Preliminary Search Report Issued Jul. 4, 2022 in French Application 21 12933 filed on Dec. 3, 2021 (with English Translation of Categories of Cited Documents), 3 pages.

(Continued)

*Primary Examiner* — Emily P Pham
(74) *Attorney, Agent, or Firm* — Oblon, McClelland, Maier & Neustadt, L.L.P.

(57)        ABSTRACT

A converter of an input voltage into at least one output voltage, including a pair of first and second piezoelectric assemblies; a first bridge including two first switching branches each having at least one first switch; a second bridge including two second switching branches each having at least one second switch; each piezoelectric assembly including a first end connected to the first bridge and a second end connected to the second bridge; each first switch being connected between a terminal of the input voltage and a first end; each second switch being connected between a terminal of the output voltage and a second end. It includes at least one complementary switch connected directly between the ends of a pair of piezoelectric assemblies, connected to a same bridge.

20 Claims, 10 Drawing Sheets

(58) Field of Classification Search
CPC ......... H02M 3/33561; H02M 3/33584; H02M
3/01; Y02B 70/10
See application file for complete search history.

(56) References Cited

U.S. PATENT DOCUMENTS 9,397,284 B2 *    7/2016   Koo ..................... H10N 30/802
2017/0012556 A1    1/2017   Jeong et al.

OTHER PUBLICATIONS

Pollett, B., Convertisseurs DC-DC piezoélectrique avec stockage provisoire d'énergie sous forme mécanique. Autre. Université Paris Saclay (COmUE), 2019, Français, NNT: 2019SACLN045, 169 pages.

* cited by examiner

1

ELECTRICAL ENERGY CONVERTER WITH AT LEAST ONE PAIR OF PIEZOELECTRIC ASSEMBLIES AND AT LEAST ONE COMPLEMENTARY SWITCH FOR DIRECT CONNECTION BETWEEN THEM, CONVERSION SYSTEM AND ASSOCIATED CONTROL METHOD

CROSS-REFERENCE TO RELATED APPLICATIONS

This application is a U.S. non-provisional application claiming the benefit of French application No. 21 12933, filed Dec. 3, 2021, which is incorporated herein by reference in its entirety.

FIELD

The present invention relates to an electrical energy converter capable of converting an input voltage to at least one output voltage, and comprising at least one pair of first and second piezoelectric assemblies, each piezoelectric assembly including at least one piezoelectric element; a first switching bridge including two first switching branches, each first switching branch including at least one first switch; at least one second switching bridge including two second switching branches, each second switching branch including at least one second switch; each piezoelectric assembly including a first end connected to the first switching bridge and a second end connected to the second switching bridge; each first switch being connected between an input voltage supply terminal and a first end respectively; and each second switch being connected between an output voltage supply terminal and a second end respectively.

The invention also relates to an electronic electrical energy conversion system comprising such an electrical energy converter and an electronic device for controlling said converter.

The invention also relates to a method of controlling such an electrical energy converter.

The invention relates to the field of electronic systems for converting electrical energy, in particular those including a piezoelectric element, in particular systems for converting into a continuous electrical energy, namely DC-DC (Direct Current—Direct Current) conversion systems, also called DC-DC conversion systems, and AC-DC (Alternating Current—Direct Current) conversion systems, also called AC-DC conversion systems.

BACKGROUND

An electrical energy converter of the above mentioned type is known from the documents FR 3 086 471 A1 and FR 3 086 472 A1, as well as from the thesis manuscript "Piezoelectric DC-DC converters with temporary storage of energy in mechanical form" by Benjamin POLLET and can be seen in FIG. 20 of the documents FR 3 086 471 A1 and FR 3 086 472 A1, and in FIG. 4.15 of the above-mentioned thesis manuscript.

The switches of the first and second switching bridges are controlled cyclically, at the main oscillation frequency of the piezoelectric assemblies around their preselected resonance mode with, between each closing of the switch(es), a phase in which the piezoelectric assemblies are in open circuit via the opening of at least one switch. The closing of each switch is advantageously carried out under a voltage of approximately zero at its terminals, and in all cases, the dosing of a switch never generates a significant variation in voltage at the terminals of the piezoelectric assemblies (less than 20%, and advantageously less than 10% of the input voltage V or of the output voltage $V_{out}$) in steady state, a control cycle typically includes six successive distinct phases, namely three phases with substantially constant voltage at each piezoelectric element and three phases with substantially constant load at said piezoelectric element, with an alternation between phases with substantially constant voltage and phases with substantially constant load.

As discussed in FR 3 086 471 A1 or in the thesis manuscript, an advantage of using two piezoelectric elements is that the output voltage is thus isolated from the input voltage, without the need for a transformer.

The isolation is capacitive and is therefore not achieved with a lossy transformer, but by the fact that the impedance of the piezoelectric resonator is very high at low frequencies and blocks any propagation of the low frequency voltage from the input to the output, and vice versa. In addition, any input common mode component equal to half the sum of the potentials at the input voltage supply terminals does not affect the output common mode component equal to half the sum of the potentials at the output voltage application terminals and vice versa. The input and output common mode potentials or components can thus evolve freely, at low frequency, relative to each other. Indeed, each piezoelectric element is modeled as a capacitor and a resonant branch connected in parallel to the capacitor, the capacitance of said capacitor being called parallel capacitance, or even, reference capacitance, and noted $C_0$. A low frequency signal of the 50/60 Hz type will then be filtered by the high impedance (for example 3.1 MΩ for $C_0$=1 nF at 50 Hz) of each of the blocked capacitances of the two piezoelectric resonators thus creating an isolation between the input and output parts of the converter.

This advantage is present even relative to a piezoelectric transformer, in which not all the energy supplied to the primary is completely transmitted to the secondary and furthermore, the primary must set in motion a larger mass, namely that of the primary plus that of the secondary, thus leading to losses.

However, the operation of such a converter is not optimal around the resonance frequency of the piezoelectric elements.

SUMMARY

The purpose of the invention is to propose an electrical energy converter including at least two piezoelectric assemblies, and an associated control method, allowing improved control of the converter, in particular with more possible voltage values during a respective phase at substantially constant voltage.

To this end, the subject matter of the invention is an electrical energy converter capable of converting an input voltage into at least one output voltage, the converter comprising:

- at least one pair of first and second piezoelectric assemblies, each piezoelectric assembly including at least one piezoelectric element,
- a first switching bridge including two first switching branches, each first switching branch including at least one first switch;
- at least one second switching bridge including two second switching branches, each second switching branch including at least one second switch;

each piezoelectric assembly including a first end connected to the first switching bridge and a second end connected to the second switching bridge;

each first switch being connected between an input voltage application terminal and a first end respectively; and each second switch being connected between a respective output voltage supply terminal and a second end respectively; and at least one complementary switch connected directly between the ends of a respective pair of first and second piezoelectric assemblies, said ends connected directly to each other via a respective complementary switch being connected to a same respective switching bridge, each complementary switch being connected only to the ends of the respective pair of first and second piezoelectric assemblies.

With the electrical energy converter according to the invention, the complementary switch makes it possible to directly connect together the first ends of a respective pair of first and second piezoelectric assemblies and then force the voltage between these first ends to zero, or even to directly connect together the second ends of said pair of piezoelectric assemblies and then force the voltage between these second ends to zero. The complementary switch then provides additional possible values for the total piezoelectric voltage at the pair of piezoelectric assemblies, regardless of the open or dosed state of the switches of the switching branches, connected between these ends of the pair of piezoelectric assemblies and the input voltage application or output voltage supply terminals.

In other words, the electrical energy converter according to the invention offers improved control, while also allowing control of the switches of the switching branches to effectively transfer power from the input to the output, but without injecting a common mode component.

During the phases with substantially constant voltage at the piezoelectric assembly terminals, the voltage at the piezoelectric assemblies does not vary and cannot induce a high-frequency common mode voltage.

Preferably, during the phases with substantially constant load at said piezoelectric assembly terminals, the closed position of at most one respective switch among the switches connected directly to the first piezoelectric assembly and at most one respective switch among the switches connected directly to the second piezoelectric assembly at the same time, all the other switches of the first and second switching branches being in the open position, avoids the connection of either of the piezoelectric assemblies between a potential of the input voltage and a potential of the output voltage, and thus avoids the introduction of a high-frequency common mode component between the input voltage and the output voltage.

Furthermore, in high step-up and high step-down configurations, the first switching branches preferably include a single first switch, or even the second switching branches preferably include a single second switch, thus saving two switches relative to the high step-up and high step-down configurations of the prior art converter with two H-bridges, such as the one visible in FIG. 20 of FR 3 086 471 A1 and FR 3 086 472 A1, and in FIG. 4.15 of the aforementioned thesis manuscript.

According to other advantageous aspects of the invention, the electrical energy converter comprises one or more of the following features, taken alone or in any technically possible combination:

the converter comprises two complementary switches, a first complementary switch being connected directly between the first ends of a respective pair of first and second piezoelectric assemblies, said first ends being connected to the first switching bridge, and a second complementary switch being connected directly between the second ends of a respective pair of first and second piezoelectric assemblies, said second ends being connected to the second switching bridge;

the converter has no direct connection between each complementary switch and a respective input voltage application terminal on the one hand, and no direct connection between each complementary switch and a respective output voltage supply terminal on the other hand;

the electrical energy converter is capable of converting the input voltage into several distinct output voltages, and includes for each respective output voltage:
a respective second switching bridge;
a respective pair of first and second piezoelectric assemblies;

the converter further comprises at least one switching assistance circuit, each switching assistance circuit being connected between the ends of a respective pair of first and second piezoelectric assemblies, said ends linked together via a respective switching assistance circuit being connected to a same respective switching bridge, each switching assistance circuit being configured to discharge a parasitic capacitance of a switch of the respective switching bridge to which it is connected, via the flow of a previously received current, and to respectively charge a parasitic capacitance of another switch of said switching bridge;

the at least one switching assistance circuit comprises two switching assistance circuits, a first switching assistance circuit being connected between the first ends of a respective pair of first and second piezoelectric assemblies, said first ends being connected to the first switching bridge, and a second switching assistance circuit being connected between the second ends of a respective pair of first and second piezoelectric assemblies, said second ends being connected to the second switching bridge;

each switching assistance circuit includes an element selected from the group consisting of; an inductor; a first set of an inductor and a diode connected in series; a second set of an inductor and a capacitor connected in series; and an additional piezoelectric element;

each switching assistance circuit preferably being constituted of an element selected from said group;

each piezoelectric assembly is constituted according to one of the group consisting of: a single piezoelectric element; a plurality of piezoelectric elements connected in series; a plurality of piezoelectric elements connected in parallel; and an arrangement of a plurality of parallel piezoelectric branches, each branch including one or more piezoelectric elements connected in series;

each first switching branch is connected between two input voltage application terminals and includes at least two first switches connected in series and connected to each other at a first midpoint, each first midpoint then being connected to a respective first end;

each second switching branch is connected between two terminals for supplying a respective output voltage and includes at least two second switches connected in series and connected together at a second midpoint, each second midpoint then being connected to a respective second end.

The invention also relates to an electronic electrical energy conversion system comprising an electrical energy converter and an electronic device for controlling the electrical energy converter, the electrical energy converter being as defined above.

According to other advantageous aspects of the invention, the electronic electrical energy conversion system comprises one or more of the following features, taken alone or in any technically possible combination:

the electronic control device is configured to control, during a respective resonance cycle of the piezoelectric assemblies, a switching of each of the switches to alternate phases with substantially constant voltage at the piezoelectric assembly terminals and phases with substantially constant load at said piezoelectric assembly terminals;

the electronic control device is further configured, during at least one substantially constant voltage phase, to control at least one respective complementary switch to the closed position;

the electronic control device is configured, during each phase with substantially constant load, to control to the closed position at the same time at most one respective switch among the switches connected directly to the first piezoelectric assembly and at most one respective switch among the switches connected directly to the second piezoelectric assembly, and in the open position all the other switches of the first and second switching branches;

in the absence of control of a respective complementary switch to the closed position during a respective substantially constant voltage phase, the value of the voltage during the substantially constant voltage phase is selected from the group of values consisting of: difference between the value of the input voltage and that of the output voltage; difference between the value of the output voltage and that of the input voltage; sum of the values of the input and output voltages; and opposite of the sum of the values of the input and output voltages; and with the control of at least one respective complementary switch in the closed position during a respective phase with substantially constant voltage, said group of values further includes: value of the input voltage; opposite of the value of the input voltage; value of the output voltage; opposite of the value of the output voltage; and zero value;

said group of values includes the value of the input voltage and the opposite of the value of the input voltage if the converter comprises a respective complementary switch connected directly between the second ends of a respective pair of first and second piezoelectric assemblies, said second ends being connected to the second switching bridge;

said group of values includes the value of the output voltage and the opposite of the value of the output voltage if the converter comprises a respective complementary switch connected directly between the first ends of a respective pair of first and second piezoelectric assemblies, said first ends being connected to the first switching bridge;

said group of values includes the value zero, if the converter comprises two complementary switches, a first complementary switch being connected directly between the first ends of a respective pair of first and second piezoelectric assemblies, said first ends being connected to the first switching bridge, and a second complementary switch being connected directly between the second ends of a respective pair of first and second piezoelectric assemblies, said second ends being connected to the second switching bridge;

the electronic electric power conversion system is a DC electric power conversion system, such as a DC-DC conversion system or an AC-DC conversion system.

The invention also has as its object, a method of controlling an electrical energy converter, the converter being as defined above, the method being implemented by an electronic control device and comprising controlling, during a respective resonance cycle of the piezoelectric assemblies, a switching of each of the switches to alternate phases with substantially constant voltage at the piezoelectric assembly terminals and phases with substantially constant load at said piezoelectric assembly terminals.

during at least one substantially constant voltage phase, at least one respective complementary switch is controlled to the closed position.

According to another advantageous aspect of the invention, the control method comprises the following feature:

during each substantially constant load phase, at most one respective switch of the switches connected directly to the first piezoelectric assembly and at most one respective switch of the switches connected directly to the second piezoelectric assembly are controlled to the closed position at the same time, and all other switches of the first and second switching branches are controlled to the open position.

BRIEF DESCRIPTION OF THE DRAWINGS

These features and advantages of the invention will become clearer upon reading the following description, given only as a non-limiting example, and made with reference to the attached drawings, in which.

DETAILED DESCRIPTION

The term "substantially equal to" defines a relationship of equality to plus or minus 10%, preferably plus or minus 5%.

Figure 1:
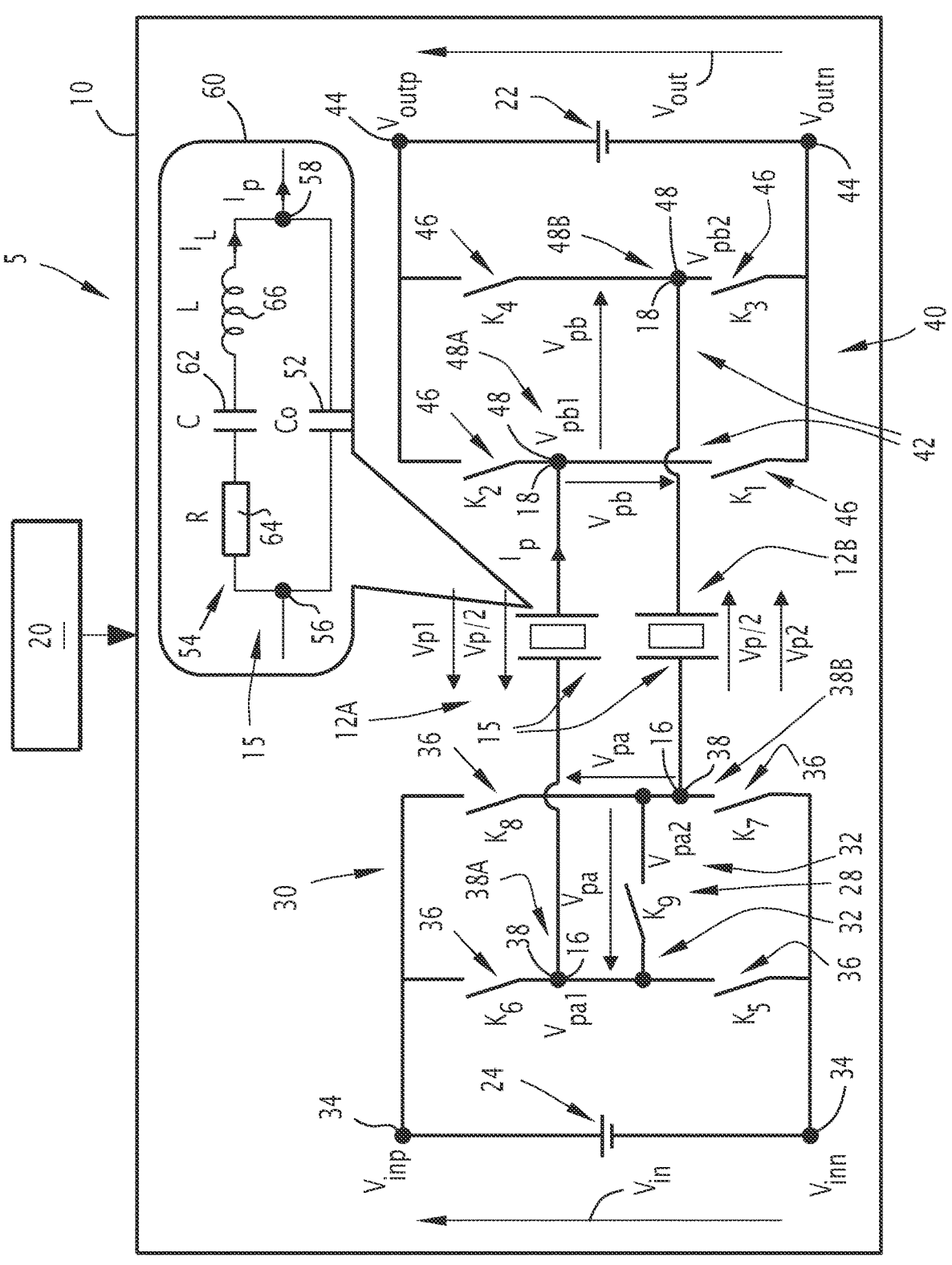
FIG. 1 is a schematic representation of an electronic electrical energy conversion system according to the invention, comprising an electrical energy converter and an electronic device for controlling said converter, the converter including a pair of first and second piezoelectric assemblies, a first switching bridge including two first switching branches, each first switching branch including two first switches, a second switching bridge including two second switching branches, each second switching branch including two second switches, each piezoelectric assembly including a first end connected to the first switching bridge and a second end connected to the second switching bridge, each first switch being connected between an input voltage application terminal and a first end respectively, each second switch being connected between an output voltage supply terminal and a second end respectively, and the converter further including a complementary switch connected directly between the first ends of said pair of piezoelectric assemblies.

In FIG. 1, an electronic electrical energy conversion system 5 comprises an electrical energy converter 10 including a pair of first 12A and second 12B piezoelectric assemblies, each piezoelectric assembly 12A, 12B including at least one piezoelectric element 15, as well as several switches $K_1$, $K_2$, $K_3$, $K_4$, $K_5$, $K_6$, $K_7$, $K_8$ capable of being controlled to alternate phases II, IV, VI at a substantially constant voltage at the terminals of the piezoelectric assemblies 12A, 128 and phases I, III, V at a substantially constant load at the terminals of the piezoelectric assemblies 12A, 128; and an electronic device 20 for controlling the electrical energy converter 10.

The electronic electrical energy conversion system 5 is typically a DC electrical energy conversion system, such as a DC-DC conversion system capable of converting a first DC electrical energy or voltage received at the input into a second DC electrical energy or voltage delivered at the output, or even an AC-DC conversion system capable of converting an AC electrical energy or voltage received at the input into a DC electrical energy or voltage delivered at the output of the conversion system 5.

When the electrical energy conversion system 5 is an AC-DC conversion system, the electrical energy conversion system 5 preferably further comprises a voltage rectifier, not shown, connected to the input of the electrical energy converter 10 and capable of rectifying the AC electrical voltage received at the input of the conversion system 5 to provide a rectified electrical voltage at the input of the converter 10, the electrical energy converter 10 preferably being a DC-DC converter capable of converting DC electrical energy or voltage into another DC electrical energy or voltage. The voltage rectifier is, for example, a bridge rectifier, such as a diode bridge. Alternatively, the voltage rectifier is formed in part by switches of the converter 10.

Figure 2:
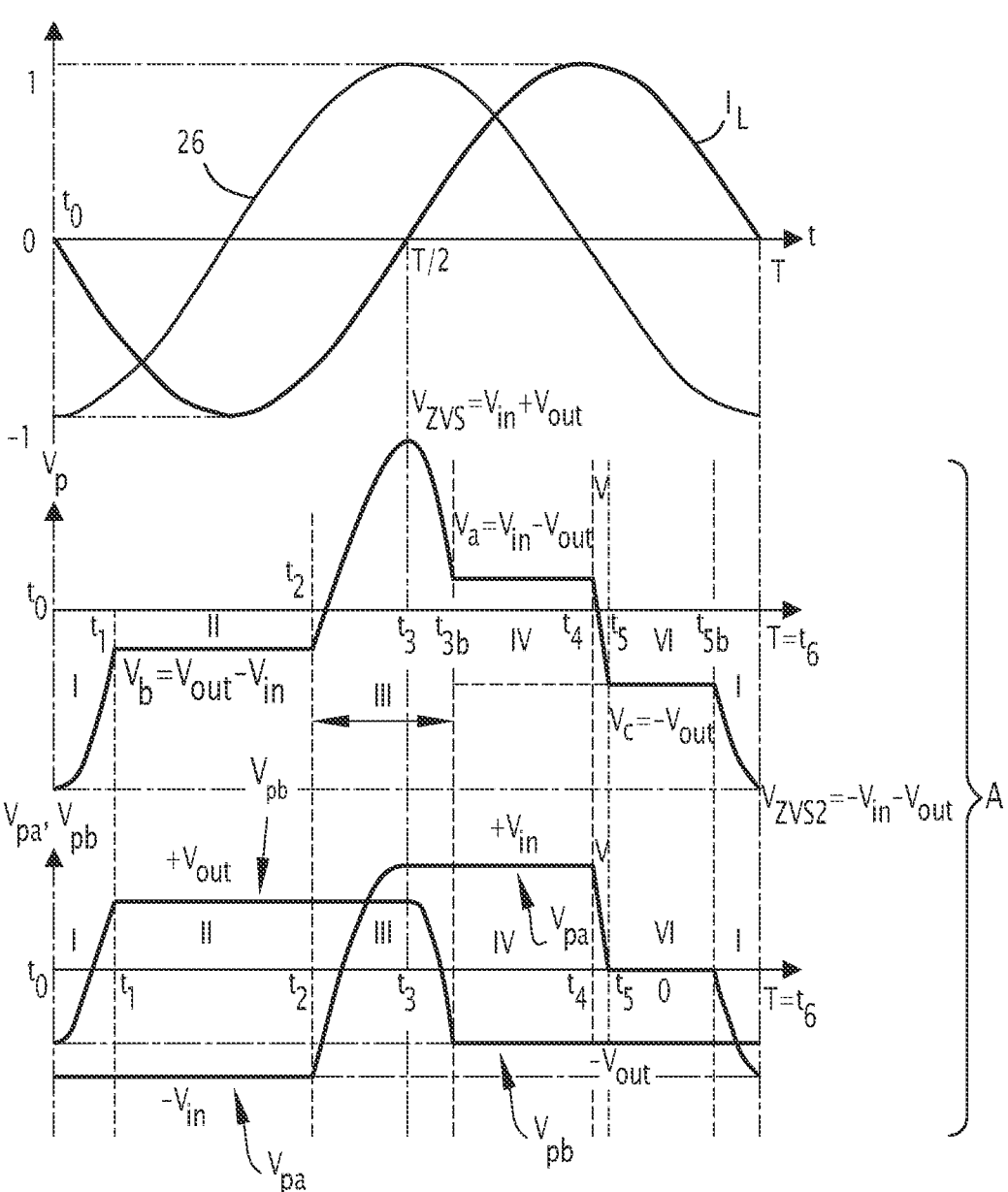
FIG. 2 is a set of curves representing a current flowing through the piezoelectric assemblies normalized to an amplitude of 1, a total mechanical deformation of the piezoelectric assemblies normalized to an amplitude of 1, a voltage between the ends of said pair of piezoelectric assemblies, a voltage between the other ends of said pair of piezoelectric assemblies, as well as a total voltage of the piezoelectric assemblies corresponding to the sum of said elementary voltages at the terminals of each piezoelectric assembly, for a step-down configuration.

The person skilled in the art will observe that these various examples for the converter system 5, whether it is a DC-DC converter system or an AC-DC converter system, are also presented in documents FR 3 086 471 A1 and FR 3 086 472 A1, particularly with respect to their FIGS. 1 and 2.

The electrical energy converter 10 is preferably a DC-DC converter and is also referred to as a DC-DC converter. The DC-DC converter is generally intended to regulate a supply voltage to a load 22 at a stable value, by being supplied by a power source 24 providing a substantially DC voltage. The power source 24 is, for example, a battery or a solar panel.

The electrical energy converter 10 is then configured to increase the value of the DC voltage between its input and its output and is then also referred to as a step-up DC-DC converter; or is configured to reduce the value of the DC voltage between its input and its output and is then referred to as a step-down DC-DC converter.

The electrical energy converter 10 is configured to provide N distinct output voltage(s), from E distinct input voltage(s), where E and N are each an integer greater than or equal to 1.

In the example of FIG. 1, the electrical energy converter 10 is configured to provide an output voltage, noted $V_{out}$, from an input voltage, noted $V_{in}$, where the number E of input voltage(s) and the number N of output voltage(s) are each equal to 1.

Figure 5:
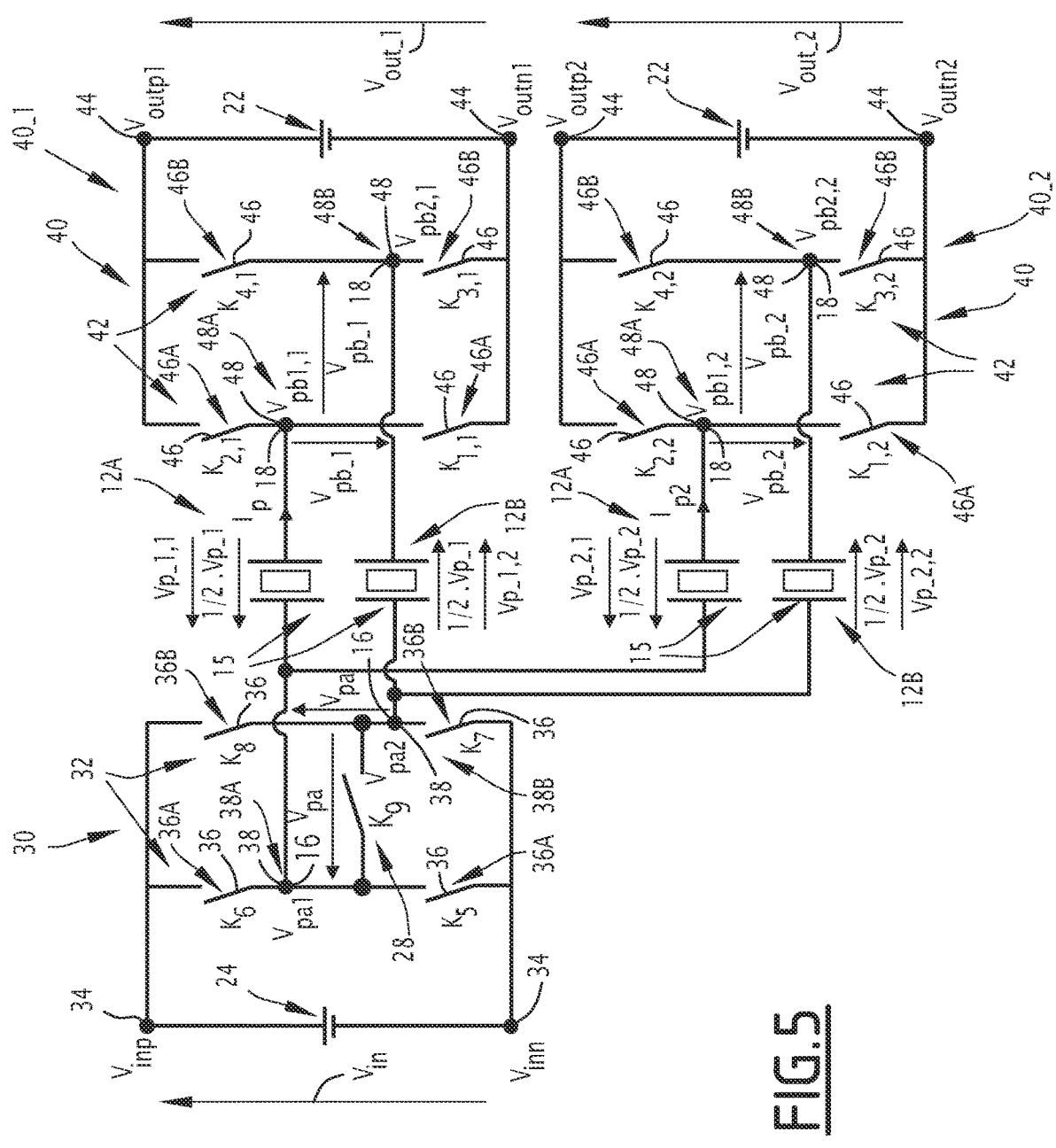
FIG. 5 is a view similar to that of FIG. 1, according to another example of the electrical energy converter, where the electrical energy converter is capable of converting the input voltage into a plurality of distinct output voltages, and includes—for each respective output voltage—a respective pair of first and second piezoelectric assemblies and a respective second switching bridge, each second switching branch being connected between two supply terminals of said respective output voltage.

In the example shown in FIG. 5, the electrical energy converter 10 is configured to deliver a plurality of distinct output voltages, noted $V_{out\_j}$ where j is an integer index between 1 and N, from the input voltage $V_{in}$, the number N of distinct output voltages then being greater than 1. According to this example, the converter 10 is typically connected to a plurality of loads 22, as shown in FIG. 5.

The electrical energy converter 10 includes the piezoelectric assemblies 12A, 128 each formed of one or more piezoelectric elements 15, and the control device 20 is configured to operate the piezoelectric material of the piezoelectric elements 15 at their resonance in order to exploit charge transfer phases to dispense with the use of an inductive element, while regulating the output voltage by maintaining the resonance of the piezoelectric material, in other words, with repeated switching cycles at an operating frequency depending on the resonance frequency of the piezoelectric elements 15, and by adjusting the duration between the respective switching within the resonance cycle.

In the steady state, the piezoelectric assemblies 12A, 12B exchange substantially zero charge and power over a resonant cycle, give or take losses. In other words, each piezoelectric assembly 12A, 126 gives back, substantially as much as it receives, energy and charge over a period. Two operating conditions then apply to the steady state/established state, namely load balance and energy balance over a resonant period. Even if this balance is not respected during transients (start-up, variation of voltage steps, change of output current), it must nevertheless be possible to reach it in steady state. This requires, in particular, a certain arrangement of the voltage steps during the resonance period. For example, for a three voltage step operation, the two extreme voltage steps are controlled during one half period of a given polarity of a current $I_L$ flowing through the piezoelectric elements 15, and the intermediate voltage step is controlled during the other half period of opposite polarity of the current $I_L$ flowing through the piezoelectric elements 15.

As is known per se, the mechanical oscillation of the piezoelectric elements 15 is approximately sinusoidal, as thus represented in FIGS. 2, 4, 8, and 10 by the curve 26 illustrating the total mechanical deformation of the piezoelectric elements 15 during a respective resonance cycle. The total mechanical deformation of the piezoelectric elements is the sum of elementary mechanical deformations of each of the piezoelectric elements 15.

An increase or decrease in the stored energy over a period leads to an increase or decrease in the oscillation amplitude, respectively. Furthermore, during a phase with a substantially constant load across the piezoelectric assembly terminals 12A, 128, that is, when the piezoelectric elements 15 are placed in a substantially open electrical circuit with little exchange of electric charges between the piezoelectric elements 15 and the exterior, an increase in the amplitude of the oscillations generates an increase in the rate of change of the voltage $V_p$ across the piezoelectric assembly terminals 12A, 12B, and during a phase II, IV, VI with a substantially constant voltage at the piezoelectric assembly terminals 12A, 128, this increase in the amplitude of oscillation leads to an increase in the current $I_L$ flowing through the piezoelectric elements 15.

By substantially constant load is meant an exchange of a charge with the exterior that is less than 10% of the charge that would have been exchanged with the exterior if the voltage had been held constant. In other words, by substantially constant charge is meant a variation in charge that is less than 10% of the charge that would have been exchanged with the exterior of the piezoelectric assemblies 12A, 128 if the voltage across the piezoelectric assembly terminals 12A, 128 had been held constant over the time period under consideration.

By substantially open electrical circuit is meant a circuit in which any leakage current leads to a variation in charge of the piezoelectric assemblies 12A, 12B of less than 10% of the charge that would have been exchanged with the exterior of the piezoelectric assemblies 12A, 126 if the voltage across the piezoelectric assemblies 12A, 128 had been held constant over the time duration considered.

By substantially constant voltage is meant a voltage variation of less than 20%, preferably less than 10%, of the input or output voltage of the converter 10. For example, if the input voltage of the converter 10 is equal to 100V, then the voltage variation during each phase II, IV, VI at substantially constant voltage, that is, on each step at substantially constant voltage, is less than 20% of this voltage, that is, less than 20V; preferably less than 10% of this voltage, that is, less than 10V. Each substantially constant voltage phase is also referred to as a voltage step.

The converter 10 then includes several switches $K_1$, $K_2$, $K_3$, $K_4$, $K_5$, $K_6$, $K_7$, $K_8$ visible on FIGS. 1, 3, 6 and 9, $K_{1.1}$, $K_{2.1}$, $K_{3.1}$, $K_{4.1}$, $K_{1.2}$, $K_{2.2}$, $K_{3.2}$, $K_{4.2}$, $K_5$, $K_6$, $K_7$, $K_8$ visible on FIG. 5, capable of being controlled to alternate phases II, IV, VI at a substantially constant voltage and phases I, III, V at a substantially constant load at the terminals of the piezoelectric assemblies 12A, 12B, within periods of substantially constant duration corresponding to the operating frequency of the converter 10, depending on the resonance frequency, also called natural frequency, of the piezoelectric elements 15. The phases I, II, V with a substantially constant load make it possible, in steady state or permanent operation, to switch from one constant voltage to another and to close the switches that must be closed when the voltage at their terminals is preferably zero, in order to have a so-called zero voltage switching, also called ZVS mode switching (Zero Voltage Switching).

The converter 10 comprises a first switching bridge 30 including two first switching branches 32, each first switching branch 32 including at least one first switch 36. Each piezoelectric assembly 12A, 12B includes a first end 16 connected to the first switching bridge 30; and each first switch 36 is connected between an input voltage $V_{in}$ application terminal 34 and a first end 16 respectively.

Of the two input voltage application terminals 34, one presents a lower potential, noted $V_{inn}$, and the other presents a higher potential, noted $V_{inp}$. The first switching bridge 30 is preferably constituted of the two first switching branches 32. To each of the two application terminals 34 of the input voltage $V_{in}$, is connected at least one first switch 36. In other words, at least one first switch 36 is connected to the application terminal 34 presenting the lower potential $V_{inn}$, also referred to as the first application terminal 34; and at least one other first switch 36 is connected to the application terminal 34 presenting the higher potential $V_{inp}$, also referred to as the second application terminal 34.

In the examples of FIGS. 1, 3, 5, 6, and 9, each first switching branch 32 includes two first switches 36 connected in series and joined together at a first midpoint 38. Each first switching branch 32 is preferably constituted of the first two switches 36.

When each first switching branch 32 includes two first switches 36 connected in series and joined together at a respective first midpoint 38, each first midpoint 38 forms a respective first end 16.

In the examples of FIGS. 1, 3, 5, 6 and 9, each first switching branch 32 is connected between the two input voltage $V_{in}$ application terminals 34.

In these examples, the two first switches 36 are noted $K_5$, $K_6$ for one of the two first switching branches 32, and $K_7$, $K_8$ for the other of the two first switching branches 32, respectively.

For the sake of distinguishing between the first switches 36 connected directly to the first piezoelectric assembly 12A and those connected directly to the second piezoelectric assembly 12B, the first switches 36 connected directly to the first piezoelectric assembly 12A are also noted 36A, and the first switches 36 connected directly to the second piezoelectric assembly 128 are also noted 36B.

In the examples of FIGS. 1, 3, 5, 6, and 9, the first switches 36A connected directly to the first piezoelectric assembly 12A are also noted as $K_5$, $K_6$, and the first switches 36B connected directly to the second piezoelectric assembly 12B are also noted as $K_7$, $K_8$.

Similarly, the first midpoint 38 connected directly to the first piezoelectric assembly 12A is also noted 38A, and the first midpoint 38 connected directly to the second piezoelectric assembly 12B is also noted 386.

The converter 10 comprises a second switching bridge 40 including two second switching branches 42, each second switching branch 42 including at least one second switch 46. Each piezoelectric assembly 12A, 12B includes a second end 18 connected to the second switching bridge 40; and each second switch 46 is connected between a respective output voltage supply terminal 44 $V_{out}$ and a second end 18.

Of the two output voltage supply terminals 44 of the output voltage $V_{out}$, one presents a lower potential, noted $V_{outn}$, and the other presents a higher potential, noted $V_{outp}$. The second switching bridge 40 is preferably constituted of the two second switching branches 42. To each of the two supply terminals 44 of the output voltage $V_{out}$ is connected at least one second switch 46. In other words, at least one second switch 46 is connected to the supply terminal 44 presenting the lower potential $V_{outn}$, also referred to as the first supply terminal 44; and at least one other second switch 46 is connected to the supply terminal 44 having the higher potential $V_{outp}$, also referred to as the second supply terminal 44.

Figure 6:
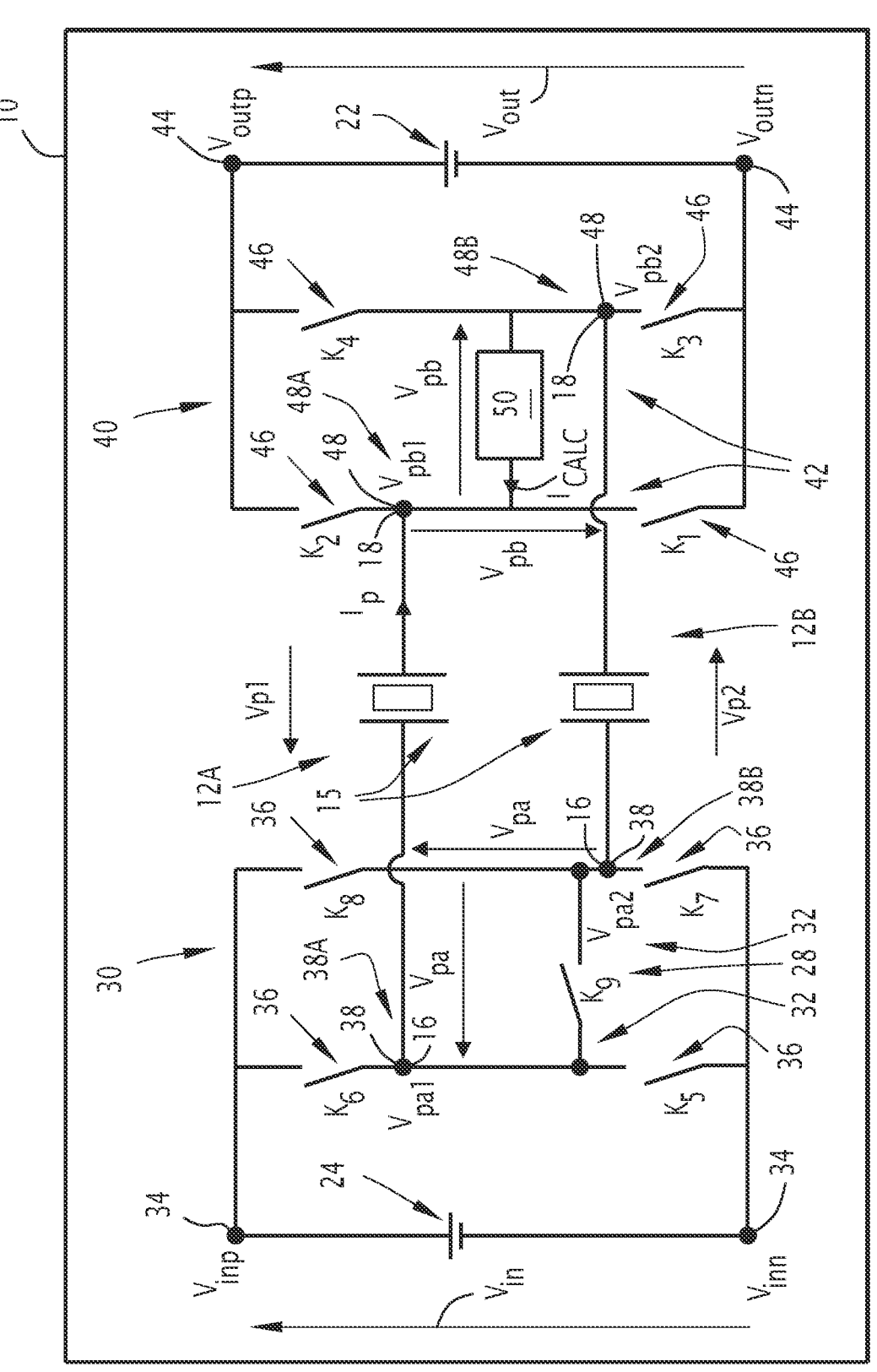
FIG. 6 is a view similar to that of FIG. 1, according to a complementary aspect where the converter further comprises a switching assistance circuit connected between the first ends of the pair of piezoelectric assemblies.

In the examples of FIGS. 1, 5, and 6, each second switching branch 42 includes two second switches 46 connected in series and joined at the second midpoint 48. Each second switching branch 42 is preferably constituted of the two second switches 46.

When each second switching branch 42 includes two second switches 46 connected in series and joined together at a respective second midpoint 48, each second midpoint 48 forms a respective second end 18.

In the examples of FIGS. 1, 5 and 6, each second switching branch 42 is connected between the two output voltage $V_{out}$ supply terminals 44.

In the examples of FIGS. 1 and 6, the two second switches 46 are noted $K_1$, $K_2$ for one of the two second switching branches 42, and $K_3$, $K_4$ for the other of the two second switching branches 42, respectively.

When the electrical energy converter 10 is configured to provide a plurality of distinct output voltages $V_{out\_j}$, it comprises, for each respective output voltage $V_{out\_j}$, a respective second switching bridge 40, each second switching branch 42 being connected between two terminals 44 for providing the respective output voltage $V_{out\_j}$.

In the example shown in FIG. 5, the electrical energy converter 10 is configured to provide two distinct output voltages, namely a first output voltage $V_{out\_1}$ and a second output voltage $V_{out\_2}$. According to this example, the converter 10 then includes two second switching bridges 40, the one associated with the first output voltage $V_{out\_1}$ being noted 40_1 and the one associated with the second output voltage $V_{out\_2}$ being noted 40_2. Each second switching branch 42 being connected between two respective output voltage supply terminals 44 $V_{out\_1}$, $V_{out\_2}$. In this example, the lower potentials of the output voltages $V_{out\_1}$, $V_{out\_2}$ are noted $V_{out1}$, $V_{out2}$, respectively, and the upper potentials of the output voltages $V_{out\_1}$, $V_{out\_2}$ are noted $V_{out1}$, $V_{out2}$, respectively. Again in this example, the second switches 46 are noted $K_{1.1}$, $K_{2.1}$, $K_{3.1}$, $K_{4.1}$, for the second switching bridge 40_1 associated with the first output voltage $V_{out\_1}$, and the second switches 46 are noted $K_{1.2}$, $K_{2.2}$, $K_{3.2}$, $K_{4.2}$ for the second switching bridge 402 associated with the second output voltage $V_{out\_2}$.

To distinguish between the second switches 46 connected directly to the first piezoelectric assembly 12A and those connected directly to the second piezoelectric assembly 12B, the second switches 46 connected directly to the first piezoelectric assembly 12A are also noted 46A, and the second switches 46 connected directly to the second piezoelectric assembly 128 are also noted 46B.

In the examples of FIGS. 1 and 6, the second switches 46A connected directly to the first piezoelectric assembly 12A are also noted as $K_1$, $K_2$, and the second switches 468 connected directly to the second piezoelectric assembly 12B are also noted as $K_3$, $K_4$.

In the example shown in FIG. 5, the second switches 46A connected directly to the first piezoelectric assembly 12A are also noted $K_{1.1}$, $K_{2.1}$ for the second switching bridge 40_1 associated with the first output voltage $V_{out\_1}$, and $K_{1.2}$, $K_{2.2}$, for the second switching bridge 40_2 associated with the second output voltage $V_{out\_2}$. In this example, the second switches 468 connected directly to the second piezoelectric assembly 12B are also noted $K_{3.1}$, $K_{4.1}$ for the second switching bridge 40_1 associated with the first output voltage $V_{out\_1}$, and $K_{3.2}$, $K_{4.2}$ for the second switching bridge 40_2 associated with the second output voltage $V_{out\_2}$.

Similarly, the second midpoint 48 connected directly to the first piezoelectric assembly 12A is also noted 48A, and the second midpoint 48 connected directly to the second piezoelectric assembly 126 is also noted 48B.

Figure 3:
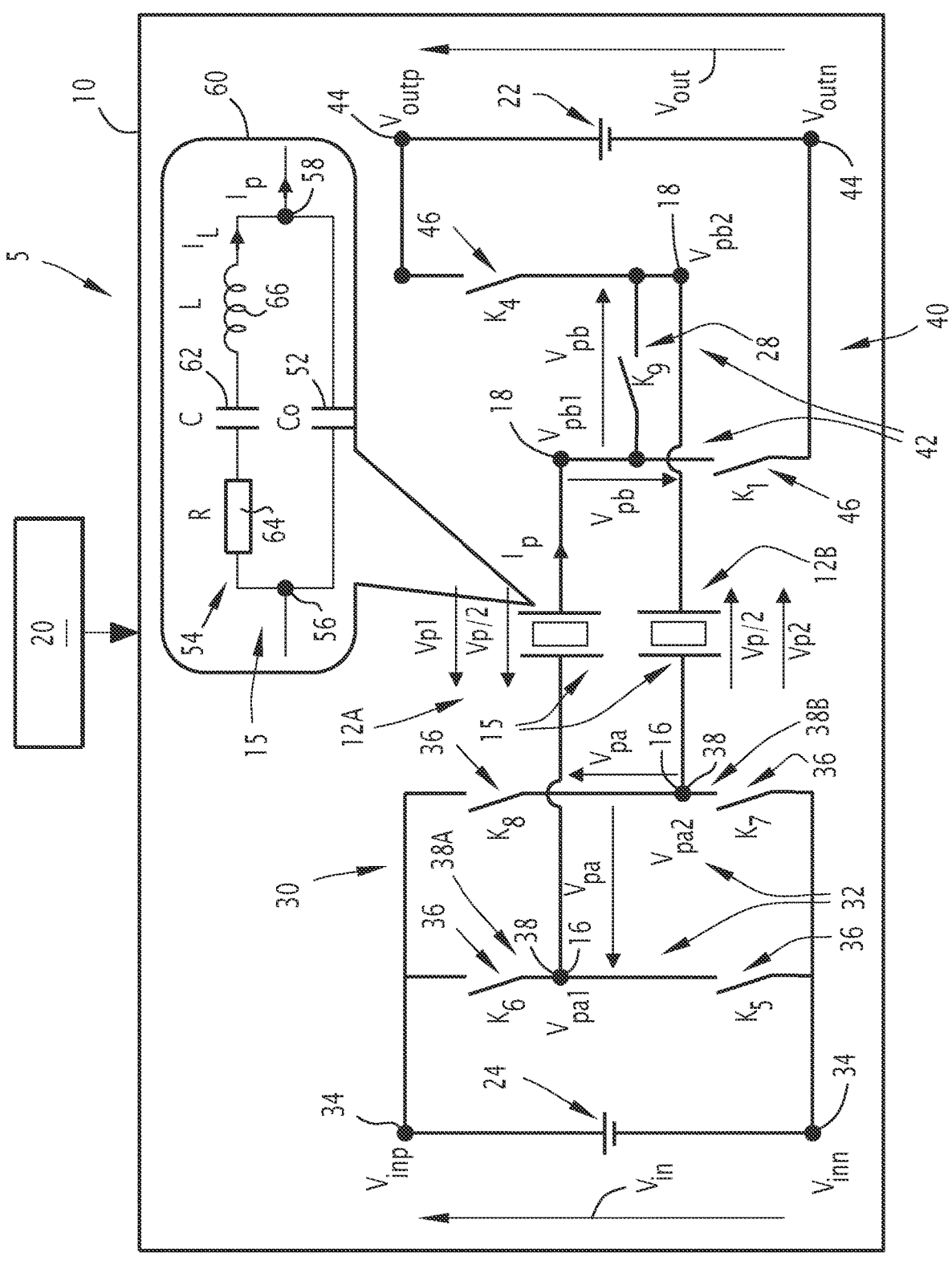
FIG. 3 is a view similar to that of FIG. 1, according to another example of the electrical energy converter, where each second switching branch includes a single second switch and the complementary switch is connected directly between the second ends of said pair of piezoelectric assemblies.
Figure 9:
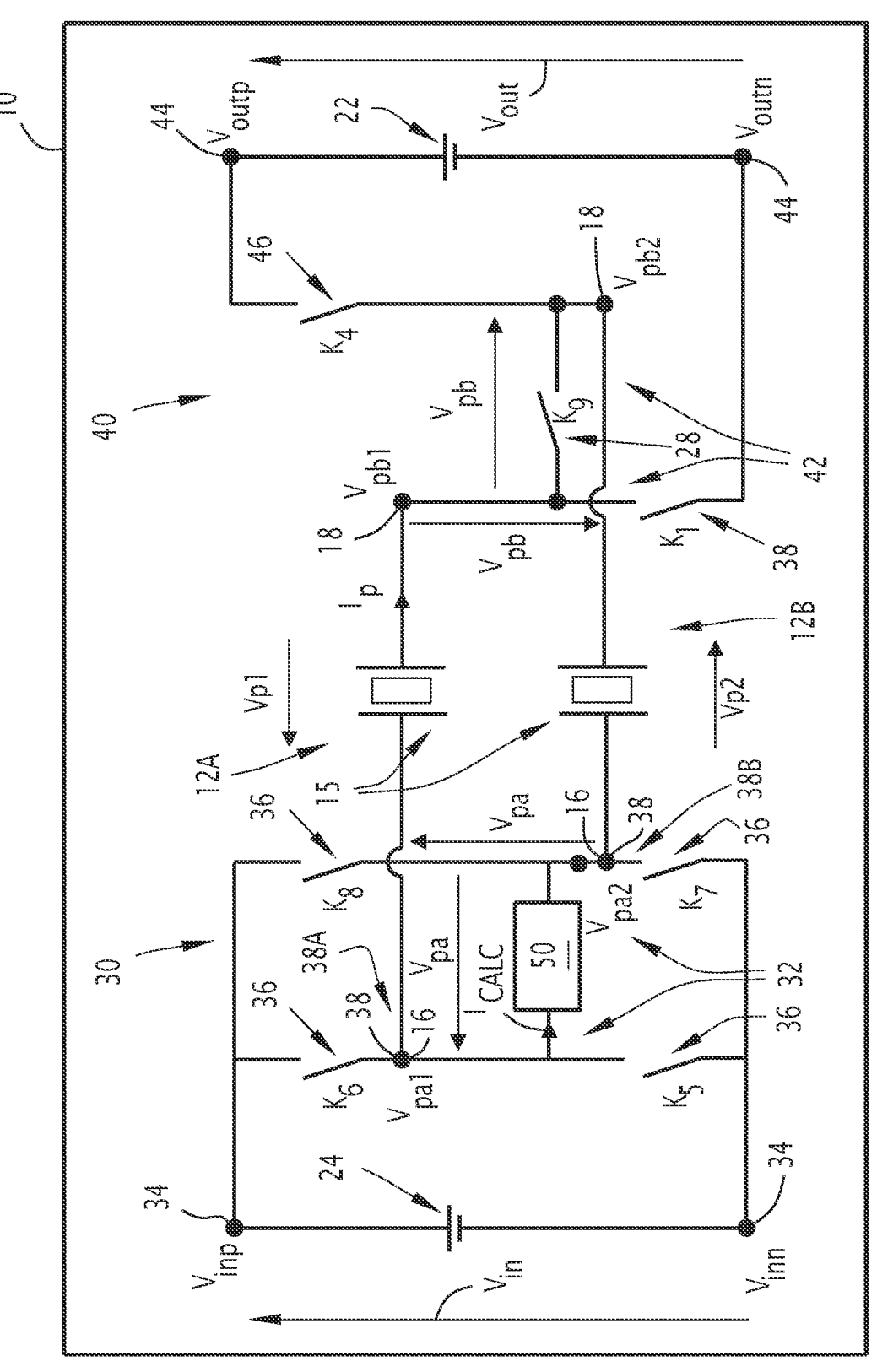
FIG. 9 is a view similar to that of FIG. 3, according to the complementary aspect with the switching assistance circuit connected between the second ends of the pair of piezoelectric assemblies.

In the examples of FIGS. 3 and 9, each second switching branch 42 includes a single second switch 46 connected between a respective output voltage supply terminal 44 and a second end 18. Preferably, each second switching branch 42 is constituted of a single second switch 46 in these examples of FIGS. 3 and 9.

In the examples of FIGS. 3 and 9, the second switch 46 is noted $K_1$ for one of the two second switching branches 42, and K4 for the other of the two second switching branches 42, respectively.

In the examples of FIGS. 3 and 9, the second switch 46A connected directly to the first piezoelectric assembly 12A is also noted $K_1$, and the second switch 466 connected directly to the second piezoelectric assembly 12B is also noted $K_4$.

The converter 10 comprises one or more pairs of first 12A and second 12B piezoelectric assemblies, each piezoelectric assembly 12A, 126 including at least one piezoelectric element 15 and being connected between respective first 38 and second 48 midpoints, the midpoints 38, 48 between which the piezoelectric assemblies 12A, 128 are connected being distinct from one piezoelectric assembly 12A to the other 128.

In the examples of FIGS. 1, 3, 6 and 9, the converter 10 comprises a single pair of first 12A and second 12B piezoelectric assemblies When the electrical energy converter 10 is configured to provide a plurality of distinct output voltages $V_{out\_j}$, it comprises, for each respective output voltage $V_{out\_j}$, a respective pair of first 12A and second 12B piezoelectric assemblies.

In the example shown in FIG. 5, the electrical energy converter 10 is configured to deliver two distinct output voltages, and then comprises two pairs of first 12A and second 128 piezoelectric assemblies.

According to the invention, the converter 10 further comprises at least one complementary switch 28 connected directly between the first ends 16, or respectively the second ends 18, of a respective pair of first 12A and second 12B piezoelectric assemblies, said ends 16, 18 being connected directly to each other via a respective complementary switch 28 being connected to a same respective switching bridge 30, 40.

In the examples of FIGS. 1, 5 and 6, the converter 10 comprises a single complementary switch 28 connected directly between the first ends 16 of a respective pair of first 12A and second 128 piezoelectric assemblies.

In the examples of FIGS. 3 and 9, the converter 10 comprises a single complementary switch 28 connected directly between the second ends 18 of a respective pair of first 12A and second 12B piezoelectric assemblies.

In an alternative embodiment, not shown, the converter 10 comprises two complementary switches 28, namely a first complementary switch 28 connected directly between the first ends 16 of a respective pair of first 12A and second 12B piezoelectric assemblies and a second complementary switch 28 connected directly between the second ends 18 of a respective pair of first 12A and second 126 piezoelectric assemblies.

As is apparent from all of the figures showing at least one complementary switch 28, that is. FIGS. 1, 3, 5, 6 and 9, each complementary switch 28 is connected only to the ends 16, 18 of the respective pair of first 12A and second 128 piezoelectric assemblies. Each complementary switch 28 is distinct from the first switches 36 and the second switches 46.

In addition, as is also apparent from all of these figures showing at least one complementary switch 28, the converter 10 has no direct connection between each complementary switch 28 and a respective input voltage application terminal 34 $V_{in}$ on the one hand, and between each complementary switch 28 and a respective output voltage supply terminal 44 $V_{out}$ on the other hand. In other words, each complementary switch 28 is not connected directly to a respective input voltage application terminal 34 $V_{in}$ and is also not connected directly to a respective output voltage supply terminal 44 $V_{out}$.

In the examples of FIGS. 1, 3, 5, 6 and 9, each complementary switch 28 is also noted $K_9$.

Each of the first 36 and second 46 switches is preferably a unidirectional current switch and a unidirectional voltage switch. The switch 36, 46 comprises, for example, a transistor, or a diode, or a transistor and diode in antiparallel, not shown. The switch 36, 46 is preferably constituted of the transistor, or the diode, or the transistor and diode in antiparallel. Alternatively, the switch 36, 46 comprises a combination of a plurality of transistors, and is preferably constituted of such a combination of a plurality of transistors. In yet another variant, the switch 36, 46 comprises a mechanical switch, such as a Micro Electro Mechanical System (MEMS) microswitch.

Each complementary switch 28 is preferably a bidirectional voltage switch. Each complementary switch 28 comprises, for example, two unidirectional, that is, monodirectional, voltage switches placed head-to-tail in series. Each unidirectional switch includes, for example, a transistor, or a diode, or a transistor and a diode in antiparallel, not shown. Each unidirectional switch is preferably constituted of the transistor, or the diode, or the transistor and the diode in antiparallel.

The person skilled in the art will observe that, in the examples of FIGS. 3 and 9, each complementary switch 28 is alternatively a single unidirectional voltage switch.

The transistor is, for example, an insulated gate field effect transistor, also known as a MOSFET (Metal Oxide Semiconductor Field Effect Transistor). Alternatively, the transistor is a bipolar transistor; an insulated gate bipolar transistor, also known as an IGBT (insulated Gate Bipolar Transistor); a silicon (Si) based transistor, a Gallium Nitride (GaN) based transistor; a silicon carbide (SiC) based transistor, or a diamond based transistor, or a thyristor.

Each piezoelectric assembly 12A, 12B is constituted according to one of the group consisting of: a single piezoelectric element 15; a plurality of piezoelectric elements 15 connected in series; a plurality of piezoelectric elements 15 connected in parallel; a piezoelectric element 15 and an auxiliary capacitor, not shown, connected in series; a piezoelectric element 15 and an auxiliary capacitor connected in parallel; and an arrangement of a plurality of parallel branches, each branch including one or more piezoelectric elements 15 connected in series or an auxiliary capacitor.

The auxiliary capacitor is typically of greater capacitance, preferably at least three times greater, than a reference capacitance $C_0$, described below, of the one or more piezoelectric elements 15.

As an optional addition, the first 12A and second 128 piezoelectric assemblies share a common piezoelectric material, while having the electrodes of the first assembly 12A distinct from those of the second assembly 128. According to this optional addition, the pairs of electrodes of the first assembly 12A, and respectively those of the second assembly 12B, cover distinct material surfaces. Furthermore, the electrodes of the first assembly 12A cannot in this case directly induce a significant electric field in the portion of the piezoelectric material belonging to the second assembly 12B. According to this further optional addition, the capacitance between any of the electrodes of the first assembly 12A and any of the electrodes of the second assembly 12B is negligible (at least 10 times smaller) compared with a reference capacitance $C_0$, described hereinafter, of each of the assemblies 12A, 128, for example, by not directly facing each other on either side of the material. This pooling of the same material makes it possible, for example, to facilitate the implementation of the first 12A and second 12B piezoelectric assembles (limitation of the number of part(s), pooling of the fixing means); and also to synchronize the vibration of the two assemblies 12A, 128, without, however, there being a significant transfer of energy from one assembly to the other ($<\frac{1}{10}$th of the output power).

The piezoelectric element 15 is known per se, and is typically modeled, close to the resonant mode implemented, as a capacitor 52 and a resonant branch 54 connected in parallel to the capacitor 52, with the capacitor 52 and resonant branch 54 connected between a first electrode 56 and a second electrode 58 of the piezoelectric element 15, as illustrated in the modeling of the piezoelectric element 15 shown in a bubble 60 in FIG. 1. The resonant branch 54 is typically an RLC branch formed by a capacitor 62, a resistor 64 and an inductor 66 connected in series. The capacitance of the capacitor 52 connected in parallel with the resonant branch 54 is referred to as the parallel capacitance, or blocked capacitance, or reference capacitance, and noted as $C_0$. The voltage across the piezoelectric element 15 then typically corresponds to the voltage across the capacitor 52.

In the present description, a so-called total piezoelectric voltage $V_p$ is, by convention, the sum of each of the voltages at the terminals of the first 12A, and respectively second 128, piezoelectric assemblies. In particular, the voltage at the terminals of the first piezoelectric assembly 12A is noted $V_{p1}$, and that at the terminals of the second piezoelectric assembly 128 is noted $V_{p2}$. The total piezoelectric voltage $V_p$ is then equal to the sum of these voltages $V_{p1}$ and $V_{p2}$ that is $V_{p1}+V_{p2}$. The two piezoelectric assemblies 12A. 12B, and the piezoelectric elements 15 constituting them, are preferably identical, and present substantially the same voltage at their terminals within a possible offset voltage Voffset, so that the voltages $V_{p1}$ and $V_{p2}$ are equal to $V_p/2+/-V_{offset}$, according to the following equations:

$$V_p = V_{p1} + V_{p2} \tag{1}$$

$$V_{p1} = \frac{V_p}{2} + V_{offset} \; et \; V_{p2} = \frac{V_p}{2} - V_{offset} \tag{2}$$

The voltage $V_{offset}$, is a substantially constant component on the scale of a resonance period and has little impact on the charge or energy balance over a period. This voltage $V_{offset}$, evolves slowly with respect to the control frequency, its oscillation is typically at a frequency at least 10 times lower than the control frequency of the piezoelectric assemblies 12A, 12B. Furthermore, when the voltages $V_{p1}+V_{p2}$ are summed, this offset voltage $V_{offset}$ disappears, and the total piezoelectric voltage $V_p$ is obtained, as described in the various cycles. In practice, this offset voltage $V_{offset}$ does not affect the control law and allows completely independent potentials $V_{inn}$ and $V_{outn}$ at low frequency.

In the example of FIG. 5, where the electrical energy converter 10 is configured to deliver the first $V_{out\_1}$, and second $V_{out\_2}$ output voltages and then comprises two pairs of first 12A and second 12B piezoelectric assemblies, the total piezoelectric voltage for a first pair of first 12A and second 12B piezoelectric assembles associated with the first output voltage $V_{out\_1}$, is noted $V_{p\_1}$, and that for a second pair of first 12A and second 12B piezoelectric assemblies associated with the second output voltage $V_{out\_2}$ is noted $V_{p\_2}$. In particular, the voltage at the terminals of the first piezoelectric assembly 12A is noted $V_{p\_1.1}$ for the first pair and $V_{p\_2.1}$ for the second pair, and that at the terminals of the second piezoelectric assembly 12B is noted $V_{p,1.2}$ for the first pair and Vp_2.2 for the second pair. Each total piezoelectric voltage $V_{p\_1}$, $V_{p\_2}$ is then equal to the sum of these respective voltages $V_{p\_1.1}$, $V_{p\_2.1}$ and $V_{p\_1.2}$, $V_{p\_2.2}$, that is, $V_{p\_1.1}+V_{p\_1.2}$, and respectively $V_{p\_2.1}+V_{p\_2.2}$. The two piezoelectric assemblies 12A, 128, and the piezoelectric elements 15 constituting them, are preferably identical, and present substantially the same voltage at their terminals as a possible close offset voltage $V_{offset\_1}$, $V_{offset\_2}$, so that the voltages $V_{p\_1.1}$, $V_{p\_2.1}$, and $V_{p\_1.2}$, $V_{p\_2.2}$ are each equal to half the respective total piezoelectric voltage $V_{p\_1}+/-V_{offset\_1}$, $V_{p\_2}+/-V_{offset\_2}$, according to the following equations:

$$V_{p\_1} = V_{p\_1,1} + V_{p\_1,2} \quad [3]$$

$$V_{p1,1} = \frac{V_{p1}}{2} + V_{offset\_1} \text{ and } V_{p1,2} = \frac{V_{p1}}{2} - V_{offset\_1} \quad [4]$$

$$V_{p\_2} = V_{p\_2,1} + V_{p\_2,2} \quad [5]$$

$$V_{p2,1} = \frac{V_{p2}}{2} + V_{offset\_2} \text{ and } V_{p2,2} = \frac{V_{p2}}{2} - V_{offset\_2} \quad [6]$$

Furthermore, in the present description and as represented in FIGS. 1, 3, 6, and 9, the voltage between the first ends 16 is noted $V_{pa}$, and is by convention equal to the difference in potentials ($V_{pa1}- V_{pa2}$), where $V_{pa1}$, is the potential of the first end 16 connected to the first piezoelectric assembly 12A, and $V_{pa2}$ is the potential of the other first end 16 connected to the second piezoelectric assembly 12B. The voltage between the second ends 18 is noted $V_{po}$ and is by convention equal to the potential difference ($V_{po2}- V_{po1}$), where Vpb1 is the potential of the second end 18 connected to the first piezoelectric assembly 12A, and $V_{po2}$ is the potential of the other second end 18 connected to the second piezoelectric assembly 12B.

By convention and as shown in FIGS. 1, 3, 6, and 9, the voltage $V_{p1}$ at the terminals of the first piezoelectric assembly is equal to the potential difference ($V_{pa1}- V_{pb1}$), and that $V_{p2}$ at the terminals of the second piezoelectric assembly is equal to the potential difference ($V_{pb2}- V_{pa2}$).

The total piezoelectric voltage $V_p$ is then equal to the sum of the voltages $V_{pa}$ and $V_{pb}$, and verifies the following equation:

$$V_p = V_{pa} + V_{pb} \quad [7]$$

In the example of FIG. 5, where the electrical energy converter 10 comprises two pairs of first 12A and second 12B piezoelectric assemblies and two second switching bridges 40_1, 40_2, the voltage between the first ends 16 is also noted $V_{pa}$, and is by convention equal to the potential difference ($V_{pa1}- V_{pa2}$), where $V_{pa1}$, is the potential of the first end 16 connected to the first piezoelectric assembly 12A, and $V_{pa2}$ is the potential of the other first end 16 connected to the second piezoelectric assembly 128. The voltage between the second ends 18 is noted $V_{pb\_1}$ for the second switching bridge 40_1 associated with the first output voltage $V_{out\_1}$, and is by convention equal to the potential difference ($V_{pb2.1}-V_{pb1.1}$), where $V_{pb1.1}$ is the potential of the second end 18 connected to the first piezoelectric assembly 12A, and $V_{pb2.1}$, is the potential of the other second end 18 connected to the second piezoelectric assembly 12B, this for the second switching bridge 40_1 associated to the first output voltage $V_{out\_1}$. Similarly, the voltage between the second ends 18 is noted $V_{pb\_2}$ for the second switching bridge 40_2 associated with the second output voltage Vout_2, and is by convention equal to the potential difference ($V_{pb2.2}-V_{pb1.2}$), where $V_{pb1,2}$ is the potential of the second end 18 connected to the first piezoelectric assembly 12A, and $V_{p2.2}$ is the potential of the other second end 18 connected to the second piezoelectric assembly 12, this for the second switching bridge 40_2 associated with the second output voltage $V_{out\_2}$.

By convention and as shown in FIG. 5, the voltage at the terminals of the first piezoelectric assembly $V_{p\_1.1}$, of the first pair is equal to the potential difference ($V_{pa1}- V_{pb1.1}$), and that at the terminals of the second piezoelectric assembly Vp_1.2 of the first pair is equal to the potential difference ($V_{pb2.1}-V_{pa2}$). Similarly, the voltage at the terminals of the first piezoelectric assembly $V_{p\_2.1}$, of the second pair is equal to the potential difference ($V_{pa1}-V_{pb1.2}$), and that at the terminals of the second piezoelectric assembly $V_{p\_2.2}$ of the second pair is equal to the potential difference ($V_{pb2.2}-V_{pa2}$).

The resonance frequency is the frequency at which the piezoelectric element 15 oscillates and consequently its current $I_L$, visible in FIG. 1. The conversion cycle is synchronized to a mechanical movement of the piezoelectric element 15, and the control frequency is then set to the mechanical oscillation frequency, in practice, this oscillation frequency depends on the operating point of the converter 10; values of the three voltage steps and the output current. Depending on the operating point, this oscillation frequency typically evolves between the so-called series resonance frequency of the piezoelectric element 15 ($\omega_s=1/\sqrt{(L_r \cdot C_r)}$ where $L_r$ and $C_r$ correspond to the inductance and capacitance of the resonant branch 54) and the so-called parallel resonance frequency of the piezoelectric element 15 ($\omega_p=1/\sqrt{(L_r \cdot C_r \cdot C_0/(C_r+C_0))}$, also referred to as the resonance frequency and anti-resonance frequency of the piezoelectric element 15, respectively. The operating frequency of the converter 10 is then between these two resonance and anti-resonance frequencies of the piezoelectric element 15. The operating point varies slowly with respect to the oscillation frequency of the piezoelectric element 15. The operating point typically evolves at less than 10 kHz, while the oscillation frequency of the piezoelectric element 15 is typically greater than or equal to 100 kHz. As a result, the operating frequency of the converter 10 evolves little from one period to the next.

Generally speaking, for the electrical energy converter 10 with the piezoelectric assemblies 12A, 12B and controlled by the electronic control device 20, the number of phases Π, IV, VI at substantially constant voltage is typically at least 2, preferably equal to 3, while being able to be greater than or equal to 4 with the implementation of the control described in the Application FR 21 07345 filed on Jul. 7, 2021.

Each phase II, IV, VI with substantially constant voltage is likely to be obtained from a combination of input and output voltages, in positive or negative value. The energy converter 10 then allows energy to be exchanged during the substantially constant voltage phases II, IV, VI, and consequently, with the combinations of voltages used to obtain these substantially constant voltage phases II, IV, VI. In particular, it is possible to transfer energy from a phase with a substantially constant voltage of low voltage to a phase with a substantially constant voltage of higher voltage, and by the play of the above-mentioned combinations to obtain a step-down converter, which may seem counter intuitive. Conversely, it is also possible to transfer energy from a phase with a substantially constant voltage of higher voltage to a phase with a substantially constant voltage of lower voltage, and by the play of the above-mentioned combinations to obtain a voltage step-up converter. The person skilled in the art will then understand that it is possible to have a step-up cycle as seen by the piezoelectric assemblies 12A, 12B while the electrical energy converter 10 is a step-down converter, and conversely to have a step-down cycle as seen by the piezoelectric assemblies 12A, 12B while the electrical energy converter 10 is a step-up converter.

By convention, if a current is supplied to the piezoelectric assemblies 12A, 128 during phase II, IV, VI at a substantially constant voltage corresponding to the highest voltage during a resonance cycle, then the cycle is considered a step-down cycle for the piezoelectric assemblies 12A, 128. Conversely, if a current is discharged, or alternatively drawn, from the piezoelectric assemblies 12A, 128 during said substantially constant voltage phase II, IV, VI for which the voltage is highest during the resonance cycle, then the cycle is considered a step-up cycle for the piezoelectric assemblies 12A, 12B. As noted above, the conversion cycle seen by the piezoelectric assemblies 12A, 128 is likely to be a step-up cycle while the electrical energy converter 10 is operating as a step-down converter, and conversely the conversion cycle seen by the piezoelectric assemblies 12A, 12B is likely to be a step-down cycle while the electrical energy converter 10 is operating as a step-up converter.

The electronic control device 20 is configured to control the electrical energy converter 10, in particular to control the operation of the switches 36, 46 of the converter, in order to alternate, during a respective resonance cycle of the piezoelectric assemblies 12A, 128, phases II, IV, VI at substantially constant voltage at the terminals of the piezoelectric assemblies 12A, 12B and phases I, III, V at substantially constant load, that is, in a substantially open circuit, at the terminals of the said piezoelectric assemblies 12A, 12B.

The electronic control device 20 is, for example, made in the form of an electronic circuit including one or more electronic components.

Alternatively, the electronic control device 20 is made in the form of a programmable logic component, such as an FPGA (Field Programmable Gate Array), or in the form of an integrated circuit, such as an ASIC (Application Specific Integrated Circuit), or in the form of a computer, such as a microcontroller, a processor.

The electronic control device 20 is further configured to, during at least one phase II, IV, VI at substantially constant voltage, control at least one respective complementary switch 28 to the closed position.

The person skilled in the art will then understand that when the converter 10 comprises a respective complementary switch 28 connected directly between the first ends 16 of a respective pair of first 12A and second 12B piezoelectric assemblies, then the control to the closed position of said complementary switch 28 makes it possible to force the voltage $V_{pa}$ between the first ends 16 to the zero value.

Similarly, when the converter 10 comprises a respective complementary switch 28 connected directly between the second ends 18 of a respective pair of first 12A and second 12B piezoelectric assemblies, then the control to the closed position of said complementary switch 28 makes it possible to force the voltage $V_{pb}$ between the second ends 18 to zero.

In yet another similar manner, when the converter 10 comprises two complementary switches 28 connected to the same pair of first 12A and second 12B piezoelectric assemblies, that is, both the first complementary switch 28 connected directly between the first ends 16 of said pair and a second complementary switch 28 connected directly between the second ends 18 of said pair, then the control to the closed position of these first and second complementary switches 28 makes it possible to force both the voltage $V_{pa}$ between the first ends 16 to the null value and the voltage $V_{pb}$ between the second ends 18 to the null value, and then to force the total piezoelectric voltage $V_p$ of said pair of piezoelectric assemblies to the null value.

In addition, the electronic control device 20 is configured, during each phase I, III, V with substantially constant load, to simultaneously control to the closed position at most one respective switch among the switches 36A, 46A connected directly to the first piezoelectric assembly 12A and at most one respective switch 368, 468 connected directly to the second piezoelectric assembly 128, and to the open position all the other switches 36, 46 of the first and second switching branches 32, 42.

According to this addition, in other words, during each phase I, III, V at substantially constant load, at most one respective switch among the switches 36A, 46A connected directly to the first piezoelectric assembly 12A and at most one respective switch among the switches 36B, 468 connected directly to the second piezoelectric assembly 128 are in the closed position at the same time, with all of the other switches 36, 46 of the first and second switching branches 32, 42 being in the open position.

According to this addition, in other words, during each phase I, III, V with substantially constant load, at each instant, at most one respective switch among the switches 36A, 46A connected directly to the first piezoelectric assembly 12A is in the closed position, and at most one respective switch among the switches 366, 466 connected directly to the second piezoelectric assembly 12B is in the closed position, and all other switches 36, 46 of the first and second switching branches 32, 42 are in the open position.

According to this addition, in the examples of FIGS. 1 and 6, during each phase I, III, V with substantially constant load, at most one respective switch among the switches $K_1$, $K_2$, $K_5$, $K_6$ is in the closed position, and at most one respective switch among the switches $K_3$, $K_4$, $K_7$, $K_8$ is in the closed position, with all of the other switches of the first and second switching branches 32, 42 in the open position.

According to this addition, in the example of FIG. 5 where the electrical energy converter 10 is configured to deliver the respective first $V_{out\_1}$, and second $V_{out\_2}$ distinct output voltages, and then comprises two pairs of first 12A and second 12B piezoelectric assemblies and two second switching bridges 40_1, 40_2, on the one hand for converting the input voltage $V_{in}$ into the first output voltage $V_{out\_1}$ via the first switching bridge 30 and the second switching bridge 40_1 associated with the first output voltage $V_{out\_1}$, during each phase I, III, V with a substantially constant load, at most one respective switch among the switches $K_{1.1}$, $K_{2.1}$, $K_5$, $K_6$ is in the closed position, and at most one respective switch among the switches $K_{3.1}$, $K_{4.1}$, $K_7$, $K_8$ is in the closed position, all the other switches of the switching bridges 30, 40_1 being in the open position. On the other hand, for the conversion of the input voltage $V_{in}$ into the second output voltage $V_{out\_2}$ via the first switching bridge 30 and the second switching bridge 402 associated with the second output voltage Vout_2, during each phase I, III, V with substantially constant load, at most one respective switch among the switches $K_{1,2}$, $K_{2,2}$, $K_5$, $K_6$ is in the closed position, and at most one respective switch among the switches $K_{3,2}$, $K_{4,2}$, $K_7$, $K_8$ is in the closed position, all the other switches of the switching bridges 30, 402 being in the open position.

According to this addition, the electronic control device 20 is preferably configured to, during phases II, IV, VI with substantially constant voltage at the terminals of the piezoelectric assemblies 12A, 12B and in the absence of control of a respective complementary switch 28 in the closed position during these phases, control the switching of the switches 36, 46 of the converter 10, in order to have the value $V_a$, $V_b$, $V_c$ of the voltage of each of the phases II, IV, VI with substantially constant voltage selected among the group of values consisting of: $V_{in}-V_{out}$ difference between the value of the input voltage $V_{in}$ and that of the output voltage $V_{out}$; $V_{out}-V_{in}$ difference between the value of the output voltage $V_{out}$ and that of the input voltage $V_{in}$; $V_{in}+V_{out}$ sum of the values of the input voltages $V_{in}$, and output voltages $V_{out}$; and the opposite of the $-V_{in}-V_{out}$ sum of the values of the input voltages $V_{in}$ and output voltages $V_{out}$.

With the control of at least one respective complementary switch 28 in the closed position during a respective phase II, IV, VI with substantially constant voltage, said group of values further includes the following possible additional values: value of the input voltage $-V_{in}$; opposite $-V_{in}$ of the value of the input voltage $V_{in}$; value of the output voltage $V_p$ opposite $-V_{out}$ of the value of the output voltage $V_{out}$; and zero value.

Said group of values includes the input voltage value $V_{in}$ and the opposite $-V_{in}$ of the input voltage value, if the converter 10 comprises a respective complementary switch 28 connected directly between the second ends 18 of a respective pair of first 12A and second 12B piezoelectric assemblies, said second ends 18 being connected to the second switching bridge 40. In this case, the control to the closed position of said complementary switch 28 allows the voltage $V_{pb}$ between the second ends 18 to be forced to zero, and the voltage $V_{pa}$ between the first ends 16 is equal to the input voltage $V_{in}$ or even the opposite $-V_{in}$ of the input voltage $V_{in}$ so that said group of values for the total piezoelectric voltage $V_p$ then further includes the input voltage value $V_{in}$ and the opposite $-V_{in}$ of the input voltage value.

The said group of values includes the value of the output voltage $V_{out}$ and the opposite $-V_{out}$ of the output voltage value, if the converter 10 comprises a respective complementary switch 28 connected directly between the first ends 16 of a respective pair of first 12A and second 12B piezoelectric assemblies, said first ends 16 being connected to the first switching bridge 30. Indeed, in this case, the control to the closed position of said complementary switch 28 allows the voltage $V_{pa}$ between the first ends 16 to be forced to zero, and the voltage $V_{pb}$ between the second ends 18 is equal to the output voltage $V_{out}$ or the opposite $-V_{out}$ of the output voltage, so that said group of values for the total piezoelectric voltage $V_p$ then additionally includes the value of the output voltage $V_{out}$ and the opposite $-V_{out}$ of the output voltage value.

Said group of values includes the value zero, if the converter 10 comprises two complementary switches 28 connected to the same pair of first 12A and second 12B piezoelectric assemblies, as previously described. In this case, the control of these first and second complementary switches 28 to the closed position allows both the voltage $V_{pa}$ between the first ends 16 and the voltage $V_{pb}$ between the second ends 18 to be forced to the zero value, and thus to force the total piezoelectric voltage $V_p$ of said pair of piezoelectric assemblies to the zero value.

The operation of the converter 10 will now be explained, by way of example, according to a voltage step-down configuration A with respect to FIG. 2 for the converter 10 of FIG. 1; and then according to a high step-up configuration TE with respect to FIG. 4 for the converter 10 of FIG. 3.

The method of controlling the electrical energy converter 10 is then implemented by the electronic control device 20 and comprises the control, during a respective resonance cycle of the piezoelectric assemblies 12A, 128, of a switching of each of the switches 36, 46 in order to alternate phases II, IV, VI at a substantially constant voltage at the terminals of the piezoelectric assemblies 12A, 12B and phases I, III, V at substantially constant load at the terminals of said piezoelectric assemblies 12A, 12B.

According to the invention, during at least one phase II, IV. VI at substantially constant voltage, at least one respective complementary switch 28 is controlled to the closed position.

In addition, for each of the respective step-down or high step-down, step-up or high step-up configurations during each phase I, III, V at substantially constant load, at most one respective switch among the switches 36A, 46A connected directly to the first piezoelectric assembly 12A and at most one respective switch among the switches 368, 468 connected directly to the second piezoelectric assembly 12B are controlled to the closed position at the same time, and all other switches 36, 46 of the first and second switching branches 32, 42 are controlled to the open position.

The person skilled in the art will note that by high step-up configuration it is typically understood to be a configuration where the increase, that is, the ratio of the output voltage V, divided by the input voltage $V_{in}$ is greater than 2, that is $V_{out}/V_{in}>2$. As a corollary, by high step-down configuration, it is typically understood to be a configuration where the decrease, that is, the ratio of the output voltage $V_{out}$ to the input voltage $V_{in}$, is less than ½, that is, $V_{out}/V_{in}<½$.

Similarly, by step-up configuration, it is typically understood to be a configuration where said increase is between 1 and 2, that is, $V_{in}<V_{out}<V_{in}$. As a corollary, a step-down configuration is typically understood to be a configuration where said increase is between ½ and 1, that is, $V_{in}2<V_{out}<V_{in}$.

The main examples of step-down configurations, that is, first step-down configuration A1 and second step-down configuration A2; high step-down configurations, that is, first high step-down configuration TA1 and second high step-down configuration TA2; step up configurations, that is, first step up configuration E1 and second step-up configuration E2; and high step-up configurations, that is, first high step-up configuration TE1 and second high step-up configuration TE2; are then listed in Table 1 below, with respective indications of the value $V_{pb}$ of the total piezoelectric voltage $V_p$ during phase II at substantially constant voltage, of the value $V_a$ of the total piezoelectric voltage $V_p$ during phase IV at substantially constant voltage and of the value $V_c$ of the total piezoelectric voltage $V_p$ during phase VI at substantially constant voltage.

The skilled person will observe that for each conversion mode, namely step-down, high step-down, step-up and high step-up, the respective first and second configurations are each time similar in this example, with simply a reversal of polarities between the respective first and second configurations.

TABLE 1

| Mode | Configuration | Phase II | Phase IV | Phase VI |
|---|---|---|---|---|
| Step-down Vin/2 < Vout < Vin (i.e. Vout > Vin-Vout) | A1 | $V_b = V_{in} - V_{out}$ | $V_a = V_{out} - V_{in}$ | $V_c = V_{out}$ |
| | A2 A (FIG. 2), A_C (FIG. 8) | $V_b = V_{out} - V_{in}$ | $V_a = V_{in} - V_{out}$ | $V_c = -V_{out}$ |
| High step-down Vout < Vin/2 (i.e., Vout < Vin-Vout) | TA1 | $V_b = V_{out}$ | $V_a = V_{in} - V_{out}$ | $V_c = -V_{out}$ |
| | TA2 | $V_b = -V_{out}$ | $V_a = V_{out} - V_{in}$ | $V_c = V_{out}$ |
| Step-up Vout/2 < Vin < Vout (i.e. Vin > Vout-Vin) | E1 | $V_b = V_{out} - V_{in}$ | $V_a = V_{in}$ | $V_c = V_{in} - V_{out}$ |
| | E2 | $V_b = V_{in} - V_{out}$ | $V_a = -V_{in}$ | $V_c = V_{out} - V_{in}$ |
| High step-up Vin < Vout/2 (i.e., Vin < Vout-Vin) | TE1 TE (FIG. 4), TE_C (FIG. 10) | $V_b = V_{in}$ | $V_a = -V_{in}$ | $V_c = V_{out} - V_{in}$ |
| | TE2 | $V_b = -V_{in}$ | $V_a = V_{in}$ | $V_c = V_{in} - V_{out}$ |

Step-Down Configuration a (with $V_{in}/2 < V_{out} < V_{in}$) (Example A2)

In FIG. 2, from the time instant t5b, preceding the time instant t1, corresponding to a first phase I, the total piezoelectric voltage $V_p$ changes from $-V_{out}$ to $-V_{in} + V_{out}$, with a voltage excursion $V_{ZVS2}$ equal to $-V_{in} - V_{out}$ time instant $t_0$ (or time instant t6) between time instants $t_{5b}$ and $t_1$. This voltage excursion allows the transition from the total piezoelectric voltage level $V_p$ equal to $-V_{out}$ to the total piezoelectric voltage level $V_p$ equal to $V_{out} - V_{in}$ in switching ZVS at the switches.

This transition takes place in two steps, a first step from the time instant $t_{5b}$ preceding the time instant $t_0$ (or time instant t6) to go from the total piezoelectric voltage $V_p$ equal to $-V_{out}$ to the total piezoelectric voltage Vp equal to $-V_{in} - V_{out}$, then a second step from time instant $t_0$ to time instant $t_1$ to transition from the total piezoelectric voltage $V_p$ equal to $-V_{in} - V_{out}$ to the total piezoelectric voltage $V_p$ equal to $-V_{in} + V_{out}$.

During this first phase I, the sign of the current $I_L$ flowing in the piezoelectric elements leads to a decrease of the total piezoelectric voltage $V_p$ during the first step until the time instant $t_0$, and then to an increase of the total piezoelectric voltage $V_{in}$ during the second step from time instant $t_0$ to time instant $t_1$.

During the first step, only the voltage $V_{pa}$ needs to be changed, and has to change from 0 to $-V_{in}$, the total piezoelectric voltage $V_p$ changing from $-V_{out}$ to $-V_{in} - V_{out}$, which it does naturally with the decrease of the total piezoelectric voltage $V_p$, the complementary switch K9 having been opened at time instant $t_{5b}$, as explained below, whereas the voltage Vpb remains constant and fixed at $-V_{out}$ by keeping the switches $K_2$ and $K_3$ on (either by maintaining a close control, or naturally via their intrinsic reverse diode, or even via an additional parallel diode).

During the first step of the first phase I, at a substantially constant load, only the switches $K_2$ and $K_3$ are then turned on or controlled to the closed position.

At the time instant $t_0$, the voltage $V_{pa}$ and the voltage $V_{pb}$ are therefore preset on $-V_{in}$ and $-V_{out}$ respectively, and the closing of the switches $K_5$, $K_8$ takes place in ZVS mode. The switches $K_5$ and $K_8$ close, whereas switches $K_2$ and $K_3$ open.

From time instant $t_0$ to time instant $t_1$, the sign of the current $I_L$ leads to an Increase in the total piezoelectric voltage $V_p$. The total piezoelectric voltage $V_p$ thus changes from $-V_{in} - V_{out}$ to $-V_{in} + V_{out}$. Only the voltage $V_{pb}$ needs to be changed from $-V_{out}$ to $+V_{out}$, which it does naturally with the increase of the total piezoelectric voltage $V_p$, whereas the voltage $V_{pa}$, remains constant and fixed at $-V_{in}$ by keeping the switches $K_5$ and $K_8$ closed.

During the second step of the first phase I, at a substantially constant load, only the switches $K_5$ and $K_8$ are then controlled to the closed position.

At the time instant $t_1$, the voltages $V_{pa}$ and $V_{pb}$ have already been reset to the values of the next voltage step, and the dosing of the switches $K_1$ and $K_4$ takes place in ZVS mode, that is, with a substantially zero voltage at their terminals before they are closed. If the switches $K_1$ and $K_4$ have an intrinsic reverse diode or an additional diode in parallel, they can be switched on naturally with regard to the sign of the current. The switches $K_5$, $K_8$ being already closed.

From the time instant $t_1$ to time instant $t_2$, corresponding to a second phase II, the switches K1, K4, K5 and K8 are switched on or controlled to a closed position. The total piezoelectric voltage $V_p$ is equal to $-V_{in} + V_{out}$. Positive power is drawn from the input voltage $V_{in}$ at the same time that positive power is supplied to the output voltage $V_{out}$.

From the time instant $t_2$ to time instant $t_{3b}$, corresponding to a third phase III, the sign of the current $I_1$ leads to an increase in the total piezoelectric voltage $V_p$ from the time instant $t_2$ to time instant $t_3$, and then a decrease in the total piezoelectric voltage $V_p$ from the time instant $t_3$ to time instant $t_{3b}$. The total piezoelectric voltage $V_p$ changes from $-V_{in} + V_{out}$ to $+V_{in} - V_{out}$, with an excursion to the voltage $V_{ZVS}$ equal to $+V_{in} + V_{out}$ at the time instant $t_3$ between time Instants $t_2$ and $t_{3b}$. This voltage excursion allows the transition from the total piezoelectric voltage level $V_p$ equal to $-V_{in} + V_{out}$ to the total piezoelectric voltage level $V_p$ equal to $V_{in} - V_{out}$ in ZVS switching of the switches.

This transition is done in two steps, a first step from the time instant $t_2$ to time instant $t_3$ to transition from the total piezoelectric voltage $V_p$ equal to $-V_{in} + V_{out}$ to the total piezoelectric voltage $V_p$ equal to $V_{in} + V_{out}$, then a second step from the time instant $t_3$ to time instant $t_{36}$ to transition from the total piezoelectric voltage $V_p$ equal to $V_{in} + V_{out}$ to the total piezoelectric voltage $V_p$ equal to $V_{in} - V_{out}$.

From the time instant $t_2$ to time instant $t_3$, corresponding to the first step of the third phase III, the sign of the current $I_L$ leads to an increase of the total piezoelectric voltage $V_p$. The total piezoelectric voltage Vp thus changes from $-V_{in} + V_{out}$ to $V_{in} + V_{out}$. Only the voltage $V_{pa}$ needs to be changed, and must transition from $-V_{in}$ to $+V_{in}$, which it does naturally with the increase of the total piezoelectric voltage $V_{pa}$ whereas the voltage Vpb remains constant and fixed at $+V_{out}$ by keeping the switches $K_1$ and $K_4$ switched on (either by maintaining a close control, or naturally via their intrinsic reverse diode, or even via an additional parallel diode).

During the first step of the third phase III, at a substantially constant load, only switches $K_1$ and $K_4$ are then controlled to the closed position.

At the time instant $t_3$, the voltage $V_{pa}$ and the voltage $V_{pb}$ are therefore preset on $+V_{in}$ and $+V_{out}$ respectively, and the closing of switches $K_6$, $K_7$ takes place in ZVS mode. Switches $K_6$ and $K_7$ close, whereas switches $K_1$ and $K_4$ open.

From the time instant $t_3$ to time instant $t_{3b}$, the sign of the current $I_1$ leads to a decrease of the total piezoelectric voltage $V_p$. The total piezoelectric voltage Vp thus changes from $V_{in}$–$V_{out}$ to $V_{in}$–$V_{out}$. Only the voltage $V_{pb}$ needs to be changed, and must transition from $+V_{out}$ to $-V_{out}$, which it does naturally with the decrease of the total piezoelectric voltage $V_p$, whereas the voltage $V_{pa}$ remains constant and fixed at $+V_{in}$ by keeping the switches $K_6$ and $K_7$ closed.

During the second step of the third phase III, at a substantially constant load, only the switches $K_6$ and $K_7$ are then controlled to the closed position.

At the time instant $t_{3b}$ the voltage $V_{pa}$ and the voltage $V_{pb}$ are then already reset to the values of the next voltage step, and the closing of the switches $K_2$, $K_3$ takes place in ZVS mode. If the switches $K_2$ and $K_3$ have an intrinsic reverse diode or an additional diode in parallel, they can be switched on naturally with regard to the sign of the current. The switches $K_6$, $K_7$ being already closed. At the time instant $t_{3b}$, the switches $K_2$ and $K_3$ close or become on.

From the time instant $t_{3b}$ to time instant $t_4$, corresponding to a fourth phase IV, the switches $K_2$, $K_3$, $K_6$ and $K_7$ are on or closed. The total piezoelectric voltage $V_p$ is equal to $V_{in}$–$V_{out}$. A positive power is drawn from the input voltage $V_{in}$ at the same time that positive power is supplied to the output voltage $V_{out}$.

From the time instant 4 to time instant $t_5$, corresponding to a fifth phase V, the sign of the current $I_1$ leads to a decrease in the total piezoelectric voltage $V_p$. The total piezoelectric voltage $V_{in}$ thus transitions from $+V_{in}$–$V_{out}$ to $-V_{out}$. Only the voltage $V_{pa}$ needs to be changed, and transitions from $+V_{in}$ to 0, which it does naturally with the decrease of the total piezoelectric voltage $V_{pa}$ whereas the voltage $V_{pb}$ remains constant and fixed at $-V_{out}$ by keeping the switches $K_2$ and $K_3$ on (either by maintaining a close control, or naturally via their intrinsic reverse diode, or via an additional diode in parallel).

During this fifth phase V, at a substantially constant load, only switches $K_2$ and $K_3$ are in the closed position.

At the time instant $t_5$, the complementary switch $K_9$ connected directly between the first ends 16 is closed, and the voltage $V_{pa}$ is then set to 0, whereas the voltage $V_{pb}$ remains constant and fixed at $-V_{out}$ by keeping the switches $K_2$ and $K_3$ on (either by maintaining a close control, or naturally via their intrinsic reverse diode, or even via an additional diode in parallel).

From the time instant is to the time instant $t_{5b}$, corresponding to a sixth phase VI, the switches $K_2$ and $K_3$ as well as the complementary switch $K_9$, are on or closed. The total piezoelectric voltage $V_p$ is equal to $-V_{out}$. A positive power is supplied to the output voltage $V_{out}$.

At the end of the sixth phase VI, at the time Instant $t_{5b}$, the complementary switch K9 connected directly between the first ends 16 is open, in order to let the voltage $V_{pa}$ pass naturally from 0 to $-V_{in}$ during the next phase with substantially constant load, namely the first phase I of the next cycle.

High TE Configuration ($V_{out}/2$>$V_{in}$) (Example TE1)

Figure 4:
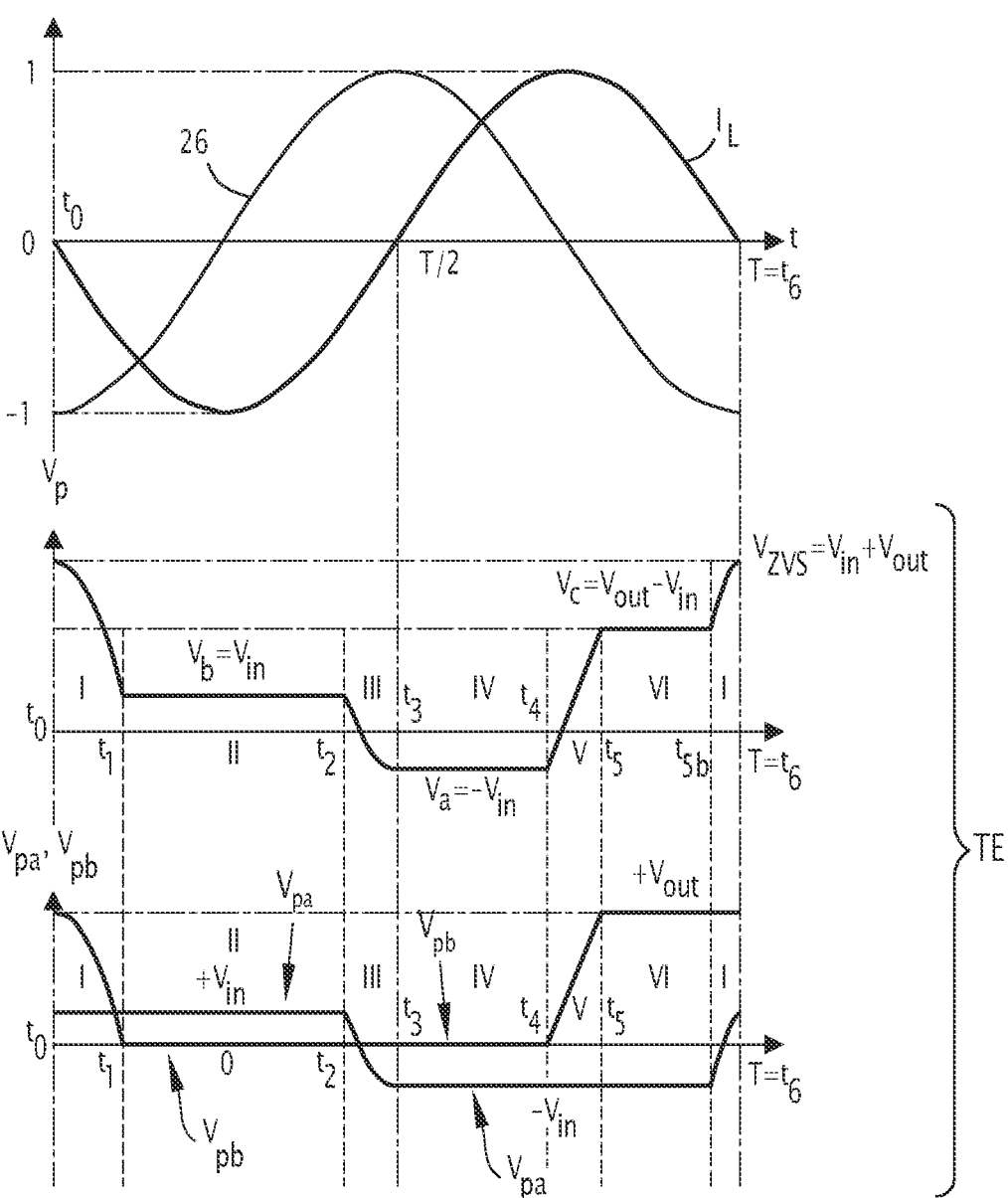
FIG. 4 is a view similar to that of FIG. 2 and according to the example of FIG. 3, for another electrical energy conversion configuration, namely a high voltage step-up configuration.

In FIG. 4, from the time instant $t_{5b}$ preceding the time instant t1, corresponding to the first phase I, the total piezoelectric voltage $V_p$ transitions from $-V_{in}$+$V_{out}$ to $V_{in}$, with a voltage excursion $V_{ZVS}$ equal to $V_{in}$+$V_{out}$ at the time instant $t_0$ (or the time instant t6) between the time instants $t_{5b}$ and $t_1$. This voltage excursion allows the transition from the total piezoelectric voltage level $V_p$ equal to $-V_{in}$+$V_{out}$ to the total piezoelectric voltage level $V_p$ equal to $V_{in}$ in switching ZVS at the switches.

This transition takes place in two steps, a first step from the time instant $t_{5b}$ preceding the time instant $t_0$ (or time instant $t_6$) to transition from the total piezoelectric voltage $V_p$ equal to $-V_{in}$+$V_{out}$ to the total piezoelectric voltage $V_p$ equal to $+V_{in}$+$V_{out}$ then a second step from the time instant $t_0$ to the time instant $t_1$ to transition from the total piezoelectric voltage $V_p$ equal to $+V_{in}$+$V_{out}$ to the total piezoelectric voltage $V_p$ equal to $+V_{in}$.

During this first phase I, the sign of the current $I_L$ flowing in the piezoelectric elements 15 leads to an increase of the total piezoelectric voltage $V_p$ during the first step until the time instant $t_0$, and then to a decrease of the total piezoelectric voltage $V_p$ during the second step from the time instant $t_0$ to time instant $t_1$.

During the first step, only the voltage $V_{pa}$ needs to be changed, and must transition from $-V_{in}$ to $+V_{in}$, the total piezoelectric voltage $V_p$ changing from $-V_{in}$+$V_{out}$ to $+V_{in}$+$V_{out}$, which it does naturally with the increase of the total piezoelectric voltage $V_p$, whereas the voltage $V_{pb}$ remains constant and fixed at $+V_{out}$ by keeping the switches $K_1$ and $K_4$ on (either by maintaining a close control, or naturally via their intrinsic reverse diode, or even via an additional diode in parallel).

During the first step of the first phase I, at a substantially constant load, only the switches $K_1$ and $K_4$ are then on or controlled to the closed position.

At the time instant $t_0$, the voltage $V_{pa}$ and the voltage $V_{pb}$ are therefore preset on $+V_{in}$ and $+V_p$ respectively, and the closing of the switches $K_6$, $K_7$ takes place in ZVS mode. The switches $K_6$ and $K_7$ close, whereas switches $K_1$ and $K_4$ open.

From the time instant $t_0$ to time instant $t_1$, the sign of the current $I_L$ leads to a decrease of the total piezoelectric voltage $V_p$. The total piezoelectric voltage $V_p$ thus transitions from $+V_{in}$+$V_{out}$ to $+V_{in}$. Only the voltage $V_{pb}$ needs to be changed from $+V_{pa}$ to 0, which it does naturally with the decrease of the total piezoelectric voltage $V_p$, whereas the voltage $V_p$, remains constant and fixed at $+V_{in}$ by keeping the switches $K_6$ and $K_7$ closed.

During the second step of the first phase I, at a substantially constant load, only the switches $K_6$ and $K_7$ are then controlled to the closed position.

At the time instant $t_1$, the complementary switch $K_1$ connected directly between the second ends 18 is on or controlled to the closed position, and the voltage $V_{pb}$ is then set to 0, whereas the voltage $V_{pa}$ remains constant and fixed at $+V_{in}$ by keeping the switches $K_6$ and $K_7$ closed.

From the time instant $t_1$ to the time instant $t_2$, corresponding to the second phase II, the switches $K_6$ and $K_7$, as well as the complementary switch $K_9$, are on or closed. The total piezoelectric voltage $V_p$ is equal to $+V_{in}$.

From the time instant $t_2$ to time instant $t_3$, corresponding to the third phase III, the sign of the current $I_L$ leads to a decrease of the total piezoelectric voltage $V_p$. The total piezoelectric voltage $V_p$ thus transitions from V, to $-V$. Only the voltage $V_{pa}$ needs to be changed from $+V_{pb}$ to $-V_{in}$, which it does naturally with the decrease of the total piezoelectric voltage $V_{pa}$ whereas the voltage $V_{pb}$ remains constant and fixed at 0 by keeping the additional switch $K_9$ closed or on.

During this third phase III, at a substantially constant load, only the complementary switch $K_9$ is then on or controlled to the closed position.

At the time instant $t_5$, the voltage $V_{pa}$ is already set to the value of the next voltage step, and the switches $K_5$, $K_8$ are closed in ZVS mode.

From the time instant $t_3$ to time instant $t_4$, corresponding to the fourth phase IV, the switches $K_5$ and $K_8$, as well as the additional switch $K_9$, are on or closed. The total piezoelectric voltage $V_p$ is equal to $-V_{in}$. Positive power is drawn from the input voltage $V_{in}$.

At the end of the fourth phase IV, at the time instant $t_4$, the complementary switch K9 connected directly between the second ends 18 is open, in order to let the voltage $V_{pb}$ transition naturally from 0 to $+V_{out}$, during the next phase with substantially constant load.

From the time instant $t_4$ to time instant $t_5$, corresponding to the fifth phase V, the sign of the current $I_L$ leads to an increase in the total piezoelectric voltage $V_p$. The total piezoelectric voltage $V_p$ thus transitions from $-V_{in}$ to $-V_{in}+V_{out}$ Only the voltage $V_{in}$ needs to be changed from 0 to $+V_{out}$, which it does naturally with the increase of the total piezoelectric voltage $V_p$, whereas the voltage $V_{pa}$ remains constant and fixed at $-V_{in}$ by keeping the switches $K_5$ and $K_8$ in the closed position.

During this fifth phase V, at a substantially constant load, only switches $K_6$ and $K_8$ are then controlled to the closed position.

At the time instant $t_5$, the voltage $V_{pa}$ and the voltage $V_{pb}$ are already reset to the values of the next voltage step, and the closing of switches $K_1$, $K_4$ takes place in ZVS mode. If switches $K_1$ and $K_4$ have an intrinsic reverse diode or an additional diode in parallel, they can be switched on naturally with regard to the sign of the current. The switches $K_5$. $K_8$ being already closed.

From the time instant $t_5$ to time instant $t_{5b}$, corresponding to the sixth phase VI, the switches $K_1$, $K_4$, $K_5$ and $K_8$ are on or closed. The total piezoelectric voltage $V_p$ is equal to $-V_{in}+V_{out}$. A positive power is drawn on the input voltage $V_{in}$ at the same time as a positive power is supplied to the output voltage $V_{out}$.

The person skilled in the art will observe that in this example the implemented control avoids having to take back energy unnecessarily on the output voltage $V_{out}$ during the fourth phase IV at substantially constant voltage where the total piezoelectric voltage $V_p$ is equal to $-V_{in}$.

Finally, the person skilled in the art will note that the voltage $V_{pb}$ no longer transitions through the value $-V_{out}$, which makes it possible to eliminate the switches $K_2$ and $K_3$ in the example of the converter 10 of FIG. 3 relative to that of FIG. 1, and thus to save two switches.

Other Configurations

According to another high step-up configuration, not shown, the voltage $V_{pb}$ no longer transitions through the value $+V_{out}$, which makes it possible to eliminate the switches K1 and K4 relative to the converter 10 of FIG. 1, and therefore to save two switches. In other words, according to this other high step-up configuration, starting from the converter 10 of FIG. 1, the switches $K_1$ and $K_4$ are removed, instead of the switches $K_2$ and $K_3$ in the example of the converter 10 of FIG. 3.

According to a first high step-down configuration TA1, not shown, the complementary switch $K_A$ is connected directly between the first ends 16, and the voltage $V_{pa}$ no longer transitions through the value $-V_{in}$ which makes it possible to eliminate the switches $K_5$ and $K_8$ with respect to the converter 10 of FIG. 1, and therefore to save two switches.

According to a second high step-down configuration TA2, not shown, the complementary switch $K_9$ is connected directly between the first ends 16, and the voltage $V_{pa}$ no longer transitions through the value $+V_{inn}$, which makes it possible to eliminate the switches $K_6$ and $K_7$ with respect to the converter 10 of FIG. 1, and thus to save two switches. In other words, according to this second high step down configuration TA2, starting from the converter 10 of FIG. 1, the switches $K_6$ and $K_7$ are removed, instead of the switches $K_5$ and $K_8$ in the example of the converter 10 of the first high step-down configuration TA1.

The person skilled in the art will then understand that this saving of two switches is valid for all the high step-up and high step-down configurations. In other words, in each of the high step-up and high step-down configurations, the first switching branches 32 preferably include a single first switch 36 or the second switching branches 42 preferably include a single second switch 46.

Typically, in each high step-up configuration, the second switching branches 42 preferably include a single second switch 46, and the complementary switch 28 is connected directly between the second ends 18.

Similarly, in each high step-down configuration, the first switching branches 32 preferably include a single first switch 36, and the complementary switch 28 is connected directly between the first ends 16.

The skilled person will also understand that in a respective step-down ($V_{in}/2<V_{out}<V_{in}$ or step-up ($V_{in}<V_{out}<2V_{in}$) configuration, the complementary switch 28 is bidirectional in voltage. This complementary switch 28 is, for example, naturally bidirectional in voltage (micro-switch, thyristor) or any assembly of transistors and/or diodes. The complementary switch 28 is, for example, realized in the form of the head-to-tail positioning of two voltage monodirectional sub-switches placed in series, each sub-switch, in addition, optionally having a reverse diode, either intrinsic to a respective transistor, or additional and placed in parallel with said transistor. If necessary, one of the two sub-switches can be controlled to the closed state in anticipation, while the other becomes on at the desired time instant (either by applying a close control; or naturally via its intrinsic reverse diode, or via an additional diode in parallel).

In a respective high step-down ($V_{out}<V_{in}/2$) or high step-up ($V_{in}<V_{out}/2$) configuration, the complementary switch 28 is voltage bidirectional; or even voltage monodirectional, such as of the same nature as the switches 36, 46.

Thus, the electrical energy converter 10 according to the invention makes it possible to avoid the total piezoelectric voltage $V_p$ transitioning through a voltage step $V_{in}+V_{out}$ or $-V_{in}$ $V_{out}$ which is not completely beneficial since it leads either to restoring energy at the input or to taking it back at the output and which, moreover, imposes a significant excursion on the total piezoelectric voltage $V_p$.

The control of the converter 10 then favors, for the total piezoelectric voltage $V_p$, the $V_{in}-V_{out}$ and $V_{out}-V_{in}$ steps which benefit both the input and the output and whose absolute value is relatively limited: $|V_{in}-V_{out}|<$Max ($V_{in}$, $V_{out}$).

Advantageously, in order for these two steps $V_{in}-V_{out}$ and $V_{out}-V_{in}$ to be fully beneficial, it is preferable during the resonance cycle that one takes place before the time instant ta (step $V_b$) and the other after this time instant $t_3$ (step $V_a$ or $V_c$).

In addition, the complementary switch 28 further allows the first ends 16 to be connected directly to each other or the second ends 18 to be connected directly to each other at a time instant when the potential difference between these ends is zero and at the same time to respect, during a phase with substantially constant load the optional condition according to which is controlled to the closed position at most one respective switch 36A. 46A connected directly to the first piezoelectric assembly 12A and at most one respective switch 36B, 46B connected directly to the second piezoelectric assembly 12B at the same time, all the other switches 36, 46 of the first and second switching branches 32, 42 being controlled to the open position.

According to this optional addition, the complementary switch 28 then provides additional possible values for the total piezoelectric voltage $V_p$ at the terminals of the pair of piezoelectric assemblies 12A, 128, while providing ZVS switching and avoiding the introduction of a common mode component.

Indeed, as an example, for the voltage $V_{pa}$ between the first ends 16, if the previous step of the voltage $V_{pa}$ presented a value equal to Vin with the switches $K_6$ and $K_7$ closed, during the opening of said switches $K_6$ and $K_7$, and if the total piezoelectric voltage $V_p$ decreases, the voltage $V_{pa}$ will decrease toward 0, but this will occur via an increase of the potential $V_{pa2}$ and a decrease of the potential $V_{pa1}$ until the potentials cross each other in $V_{in}/2$. However, keeping the switches $K_6$ and $K_7$ closed to let the potentials $V_{pa1}$ and $V_{pa2}$ meet at 0 or $V_{in}$ would result in the injection of a common mode component on the output. The complementary switch 28 connected directly between the first ends 16 then allows to remedy this, while avoiding the Injection of this common mode component on the output.

In practice, whether for the voltage $V_{pa}$ or the voltage $V_{pb}$, if the previous voltage step presents a non-zero value, then the zero value would be obtained at $V_{pa1}=V_{pa2}=V_{in}/2$ for the voltage $V_{pa}$ and at $V_{pb1}=V_{pb2}=V_{out}/2$ for the voltage $V_{pb}$. The complementary switch 28 connected directly between the first ends 16 then allows to maintain a zero value state for the voltage $V_{pa}$ and can typically be controlled to the closed state at the transition to 0 at $V_{pa1}=V_{pa2}=V_{in}/2$. Similarly, the complementary switch 28 connected directly between the second ends 18 allows to maintain a zero value state for the voltage $V_{pb}$ and can typically be controlled to the closed state of the transition to 0 at $V_{pb1}=V_{pb2}=V_{out}/2$.

As an optional addition, in the examples of FIGS. 6 to 10, the converter 10 further comprises at least one switching assistance circuit 50, each switching assistance circuit 50 being connected to a respective midpoint among the first 38 and second 48 midpoints, each switching assistance circuit 50 being configured to, via the flow of a previously received current, discharge a parasitic capacitance of at least one switch 36, 46 of the respective switching bridge 30, 40 to which it is connected, and respectively charge at least one parasitic capacitance of another switch 36, 46 of said switching bridge 30, 40.

In the examples of FIGS. 6 and 9, the converter 10 comprises a single switching assistance circuit 50 connected to either the first switching bridge 30 or the second switching bridge 40. In the example of FIG. 6, the single switching assistance circuit 50 is connected to the second switching bridge 40. In the example of FIG. 9, the single switching assistance circuit 50 is connected to the first switching bridge 30.

In the examples of FIGS. 6 and 9, the second switching bridge 40 includes two second switching branches 42, respectively the first switching bridge 30 includes two first switching branches 32; and the switching assistance circuit 50 is then connected between the respective midpoints 38, 48 of the two switching branches 32, 42 of said bridge 30, 40. In the example of FIG. 6, the switching assistance circuit 50 is then connected between the second midpoints 48 of the two second switching branches 42 of the second switching bridge 40. Similarly, in the example of FIG. 9, the switching assistance circuit 50 is then connected between the first midpoints 38 of the first two switching branches 32 of the first switching bridge 30.

Alternatively, not shown, the converter 10 comprises two switching assistance circuits 50, with a first switching assistance circuit being connected to the first switching bridge 30 and a second switching assistance circuit connected to the second switching bridge 40.

According to this variant, the skilled person will understand that each switching assistance circuit 50 is likely to be connected between the respective midpoints 38, 48 of the two switching branches 32, 42.

Each switching assistance circuit 50 is configured, via the flow of a previously received $I_{CALC}$ current, to discharge at least one parasitic capacitance of a switch 36, 46, preferably a switch to be closed, of the respective switching bridge 30, 40 to which it is connected; respectively, to charge at least one parasitic capacitance of another switch 36, 46, preferably a switch to be opened or held open, of said switching bridge 30, 40.

Each of the switches of said switching bridge 30 is open during the flow, by the switching assistance circuit 50, of the previously received current.

Following this current flow, the switch(es) 36, 46 the parasitic capacitance of which has been discharged by the switching assistance circuit 50 is/are closed. The other switch(es) 36, 46 whose parasitic capacitance has been charged by the switching assistance circuit 50 remains open.

Figure 7:
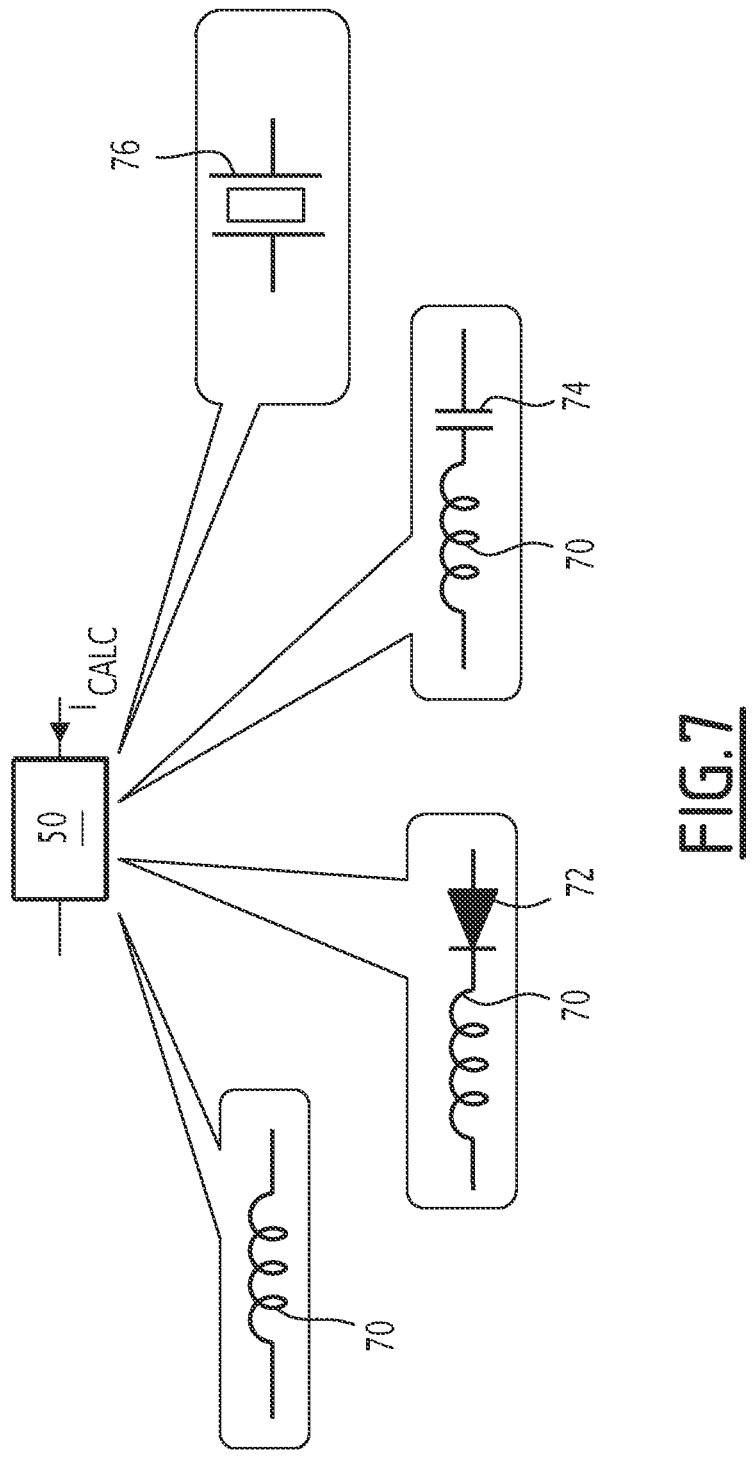
FIG. 7 is a schematic representation of different types of switching assistance circuits.

Each switching assistance circuit 50 includes, for example, an inductor 70; or a first set of the inductor 70 and a diode 72 connected in series; or a second set of the inductor 70 and a capacitor 74 connected in series; or even an additional piezoelectric element 76, as shown in FIG. 7.

Each switching assistance circuit 50 is, for example, an inductor 70, the inductor 70 preferably constituted of a coil and a magnetic circuit. Alternatively, each switching assistance circuit 50 is in the form of the first set of inductor 70 and diode 72 connected in series, and preferably constituted of said first set of inductor 70 and diode 72. In yet another variant, each switching assistance circuit 50 is in the form of the second set of inductor 70 and capacitor 74 connected in series, and preferably constituted of said second set of inductor 70 and capacitor 74. Alternatively, each switching assistance circuit 50 is in the form of the additional piezoelectric element 76, and preferably constituted of the additional piezoelectric element 76.

In the example of the embodiment where the switching assistance circuit 50 is in the form of the inductor 70 alone, the inductor 70 sees its current increase over half a period, that is, when the voltage at its terminals is positive; then its current decreases over the other half period, that is, when the voltage at its terminals is negative. This example of the implementation of the switching assistance circuit 50 preferably requires that the voltage at the terminals of the inductor 70 be substantially zero on average, otherwise there is a risk of current drift. If the switching assistance circuit 50 is connected to the second bridge 40, in particular between the second midpoints 48, the voltage at the Inductor 70 is the voltage $V_{pb}$. Corollary, if the switching assistance circuit 50 is connected to the first bridge 30, in particular between the first midpoints 38, the voltage at the terminals of the inductor 70 is the voltage $V_{pa}$.

The variant where the switching assistance circuit 50 is in the form of the inductor 70 and the diode 72 connected in series, allows the inductor 70 to be charged only over a half period with the correct polarity, particularly for cycles where the $I_{CALC}$ current is received during a time period with only one polarity. In particular, the diode 72 then avoids charging the inductor 70 with a reverse current. This unidirectional current operation also reduces the effective current seen by the inductor 70 and thus the losses. Furthermore, the switching assistance circuit 50 according to this variant is not sensitive to the presence of a DC component as long as the DC component is in the direction of blocking the diode 72.

The variant where the switching assistance circuit 50 is in the form of the inductor 70 and the capacitor 74 connected in series, allows—relative to the example of the inductor 70 alone—to reduce or even eliminate a possible DC component. Nevertheless, the capacitor 74 can be quite bulky. Indeed, the voltage at the terminals of the capacitor 74 must evolve little, that is, in a small proportion, relative to the input voltage $V_{in}$ or the output voltage $V_{out}$, for example, have an amplitude lower than 50% of the input voltage $V_{in}$ or output voltage $V_{out}$.

According to the variant where the switching assistance circuit 50 is in the form of the additional piezoelectric element 76, from the moment the control of the converter 10 is carried out between the resonance and antiresonance frequency of the additional piezoelectric element 76, this latter begins to oscillate and to produce a substantially $I_{CALC}$ current in quadrature with the voltage at its terminals, such as the voltage $V_{pb}$, if the additional piezoelectric element 76 is connected to the second bridge 40 between the second midpoints 48, or even the voltage Vpa if the additional piezoelectric element 76 is connected to the first bridge 30 between the first midpoints 38. The $I_{CALC}$ current then transitions through an extrema around the time instant t3 for the step-down cycle A_C, thereby providing the voltage inversion function $V_{pb}$ between the time instants $t_2$ and $t_3$; or similarly around the time instant $t_0$ for the high step-up cycle TE_C subsequently described with respect to FIG. 10, thereby providing the voltage inversion function $V_{pa}$ between the time instants $t_0$ and $t_1$.

The additional piezoelectric element 76 is typically at least 3 times smaller than the piezoelectric element(s) 15 of the converter 10, with the additional piezoelectric element 76 only having to charge/discharge the parasitic capacitances of the switches 36, 46. The parasitic capacitance of the switches 36, 46 is in fact considered to be at least three times less than the reference capacitance $C_0$ of the piezoelectric element(s) 15 of the converter 10. This variant where the switching assistance circuit 50 is in the form of the additional piezoelectric element 76 is insensitive to a possible DC component (regardless of its polarity), and the switching assistance circuit 50 is suitable for connection to both the first bridge 30 (voltage $V_{pa}$) and the second bridge 40 (voltage $V_{pb}$).

In other words, the reference capacitance of the additional piezoelectric element 76 is at least three times less than the reference capacitance $C_0$ of each piezoelectric assembly 12 connected between respective first 38 and second 48 midpoints.

Figure 8:
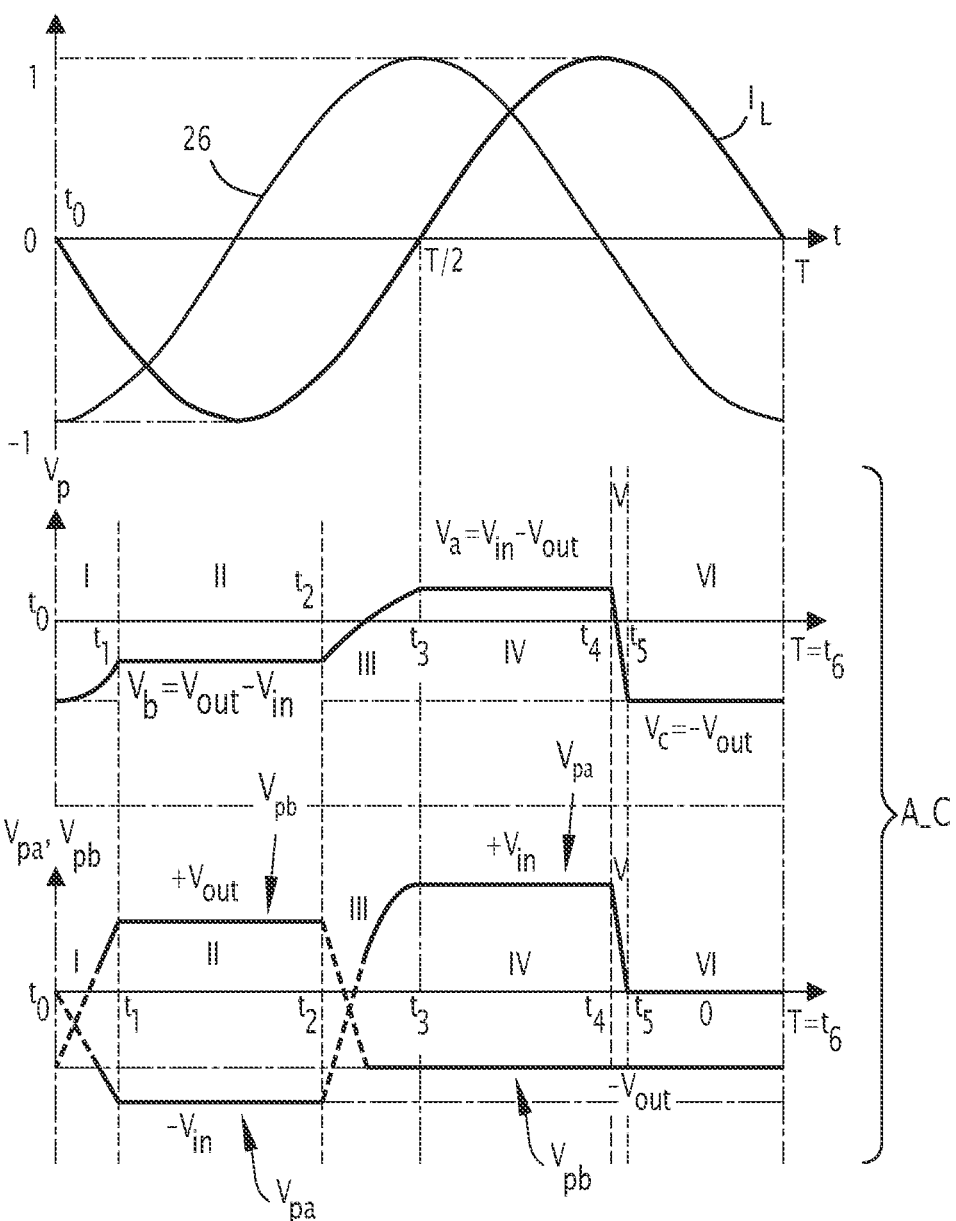
FIG. 8 is a view similar to that of FIG. 2, according to the complementary aspect of FIG. 6.

The operation of the converter 10 in the example of FIG. 6 will now be explained according to a voltage step-down configuration A_C with reference to FIG. 8. The difference resulting from the switching assistance circuit 50 according to the additional feature relates to the changes in the voltages $V_{pa}$ and $V_{pb}$ between the time instant $t_2$ and $t_3$ and between the time instants t0 and t1 in the case of the step-down configuration A_C, and more particularly to the areas shown as dotted lines in FIG. 8, this to mark the difference.

The conversion cycle of the converter 10 according to the additional feature is described below for the step-down configuration A_C, focusing on the differences with respect to the conversion cycle of the converter 10 of FIG. 1 for the same step-down configuration A.

For the step-down configuration A_C, between the time instants $t_1$ and $t_2$, according to the example of the embodiment of the switching assistance circuit 50, the inductor 70 or even the additional piezoelectric element 76 sees its $I_{CALC}$ current increase, this under the voltage $V_{pb}$ equal to $V_{out}$. At the time instant $t_2$, the $I_{CALC}$ current is positive.

Just before the time instant $t_2$, the total piezoelectric voltage $V_p$ is equal to $V_{out}-V_{in}$, the voltage $V_{pa}$ being equal to $-V_{in}$, and the voltage $V_{pb}$ being equal to $+V_{out}$; and the switches $K_5$, $K_8$, $K_1$, $K_4$ are closed.

At the time instant $t_2$, all the switches that were closed open. The $I_{CALC}$ current then charges the parasitic capacitances of switches $K_1$, $K_4$, while it discharges the parasitic capacitances of switches $K_2$ and $K_3$. Similarly, through the piezoelectric assemblies 12, the voltage of which evolves slowly, the $I_{CALC}$ current partially charges the parasitic capacitances of switches $K_5$, $K_8$, while it partially discharges the parasitic capacitances of switches $K_6$, $K_7$. The voltage $V_{pb}$ thus evolves from $+V_{out}$ to $-V_{out}$, whereas the voltage $V_{pa}$ evolves substantially from $-V_{in}$ to $-V_{in}+2V_{out}$ plus the evolution of the total piezoelectric voltage $V_P$ since the time instant $t_2$.

The voltage inversion $V_{pb}$ is considered completed before the total piezoelectric voltage $V_p$ reaches the next step $V_a$. Indeed, even if the amplitude of the $I_{CALC}$ current in the switching assistance circuit 50 is much lower than the amplitude of the internal current $I_L$ of the piezoelectric elements 15 (for example, at least 3 times lower to limit its size), this latter nevertheless only has to charge/discharge the parasitic capacitances of the switches 36, 46 considered much lower than the reference capacitance $C_0$ of the piezoelectric elements (at least a factor of 3). Furthermore, the $I_{CALC}$ current in the switching assistance circuit 50 approaches its maximum value at the time instant $t_3$, while the internal current $I_L$ approaches 0 at said time instant $t_3$.

Once the complete inversion of the voltage $V_{pb}$ is reached (transition from $V_{out}$ to $-V_{out}$), then the switches $K_2$ and $K_3$ are closed so as to fix the voltage $V_{pb}$ whereas the voltage $V_{pa}$ continues its progression to $V_{in}$ under the effect of the natural increase of the total piezoelectric voltage $V_p$.

At the time instant ta, the switches $K_6$ and $K_7$ are closed. The switches $K_2$ and $K_3$ are also closed if this had not already been done before, that is, if the voltage $V_{pb}$ had not yet reached $-V_{out}$.

In addition, if the switches $K_2$ and $K_3$ include an intrinsic reverse diode or an additional diode in parallel, they can be switched on naturally with respect to the sign of the internal current $I_L$ after the time instant $t_3$, or with respect to the residual current $I_{CALC}$ before the time instant $t_3$.

The voltage excursion of the total piezoelectric voltage Vp is thus limited between the time instants $t_2$ and $t_4$ going from $V_{out}-V_{in}$, to $V_{in}-V_{out}$, instead of going from $V_{out}$, $-V_{in}$ to $+V_{out}$ with the converter 10 of FIG. 1 (in the case of the step-down configuration A to ensure zero voltage switching of the switches 36, 46), that is, an excursion of $2V_{in}2V_{out}$ instead of $2V_{in}$, while ensuring zero voltage switching of the switches 36, 46.

The fourth IV and fifth V phases of the conversion cycle of the converter 10 according to the complementary aspect are then unchanged relative to those of the conversion cycle of the converter 10 of FIG. 1.

Between the time instants $t_5$ and $t_6$, according to the example of the embodiment of the switching assistance circuit 50, the inductor 70 or even the additional piezoelectric element 76 sees its $I_{CALC}$ current decrease, this under the voltage $V_{pb}$ equal to $-V_{out}$. At time instant t6, the $I_{CALC}$ current is negative.

Just before the time instant $t_0$, the total piezoelectric voltage $V_p$ is equal to $-V_{out}$, the voltage $V_{pa}$ being equal to 0, and the voltage $V_{pb}$ being equal to $-V_{out}$; and the switches $K_2$, $K_3$, as well as the complementary switch $K_9$, are closed.

At time instant $t_6$, all the switches that were closed, open. The $I_{CALC}$ current then charges the parasitic capacitances of switches $K_2$ and $K_3$, while it discharges the parasitic capacitances of switches $K_1$, $K_4$. Similarly, through the slowly evolving voltage of the piezoelectric assemblies 12, the $I_{CALC}$ current partially discharges the parasitic capacitances of switches $K_5$, $K_8$.

As $V_{in} < 2V_{out}$, the voltage $V_{pa}$ reaches $-V_{in}$ before the voltage $V_{pb}$ reaches $V_{out}$, the voltage $V_{pa}$ having started from 0 (zero value at the closed complementary switch $K_9$), whereas the voltage $V_{pb}$ has started from $-V_{out}$. The inversion of the voltage $V_{pb}$ is then only partial, because as soon as the voltage $V_{pa}$ reaches $-V_{in}$ the switches $K_5$ and $K_8$ close (for example, because of the inverted diodes which become conducting). It is then necessary to wait until the total piezoelectric voltage $V_p$ reaches the next step $V_b$, equal to $V_{out}-V_{in}$, in the time instant $t_1$ for the inversion of the voltage $V_{pb}$ to be complete.

Once the complete inversion of the voltage $V_{pb}$ is reached (transition from $-V_{out}$ to $+V_{out}$), then the switches $K_1$ and $K_4$ are closed in order to fix the voltage $V_{pb}$.

Figure 10:
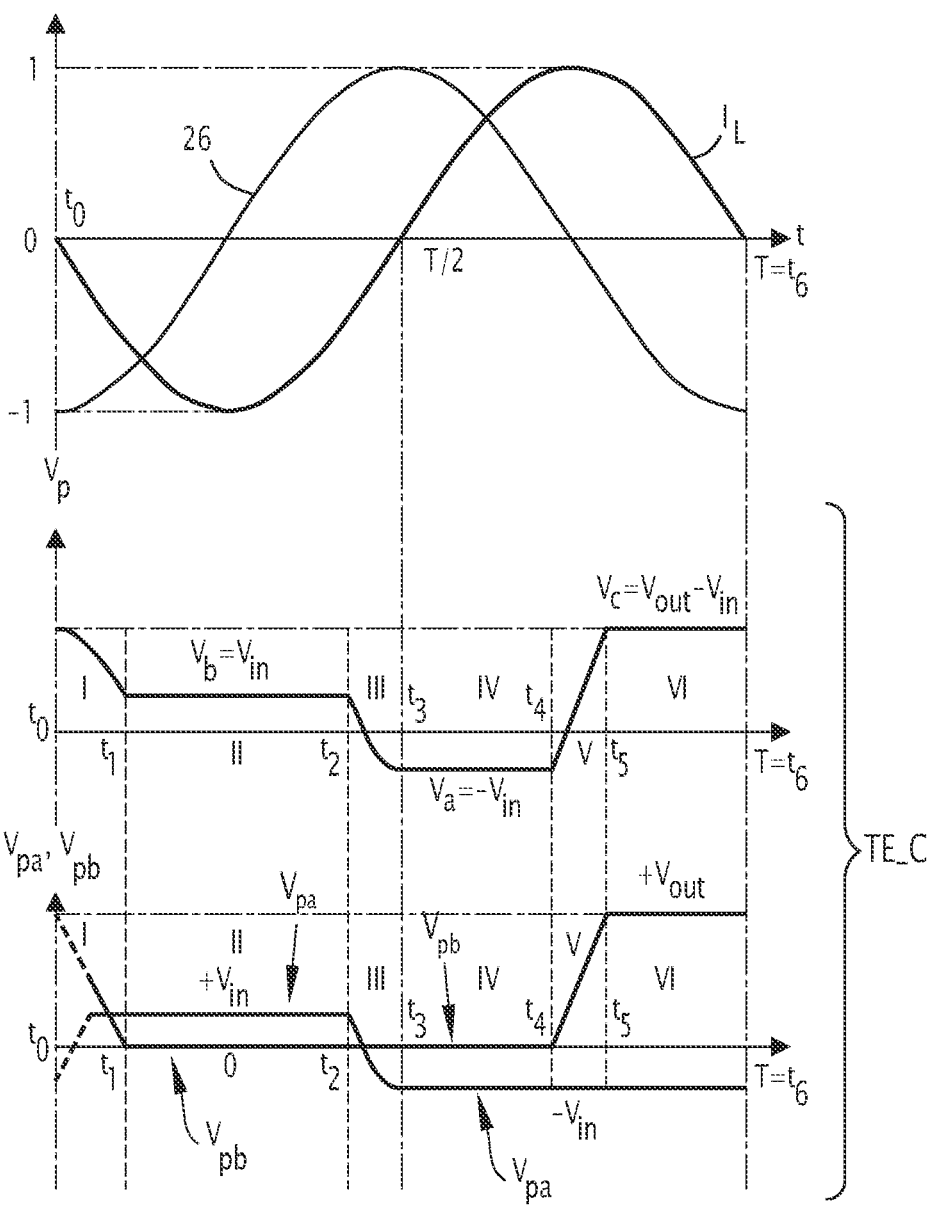
FIG. 10 is a view similar to that of FIG. 4, according to the complementary aspect of FIG. 9.

Again, the voltage excursion of the total piezoelectric voltage $V_p$ is thus limited between the time instants $t_5$ and $t_1$, this going from $-V_{out}$ to $V_{out}-V_{in}$, instead of from $-V_{in}-V_{out}$ to $V_{out}-V_{in}$ with the converter 10 of FIG. 1 (in the case of the step-down configuration A to ensure zero voltage switching of the switches 36, 46), that is, an excursion of $2V_{out}-V_{in}$ instead of $2V_{out}$, while ensuring zero voltage switching of the switches 36, 46, FIGS. 9 and 10 illustrate an alternative embodiment of the converter 10 for which the switching assistance circuit 50 is connected to the second switching bridge 40, for example, between the second midpoints 48 of the second switching branches 42.

The operation of the converter 10 in the example of FIG. 9 will now be explained according to a high step-up configuration TE_C with respect to FIG. 10. The difference resulting from the switching assistance circuit 50 according to this additional feature relates to the evolution in the voltages $V_{pa}$ and $V_{pb}$ between the time instants $t_0$ and $t_1$, and more particularly to the areas represented as dotted lines in FIG. 10, this to mark the difference.

The conversion cycle of the converter 10 according to this complementary aspect is described below for the high step-up configuration TE_C, focusing on the differences relative to the conversion cycle of the converter 10 of FIG. 3 for the same step-up configuration, noted TE in FIG. 4.

For the step-down configuration A_C, described earlier, it was the voltage $V_{pa}$ that had a homogeneous polarity on each of the two half-periods with a polarity Inversion between the two half-periods, and it was then preferable to arrange the switching assistance circuit 50 on the side of the voltage $V_{pa}$, that is, connected to the first switching bridge 30, between the respective first midpoints 38.

This time, for the high step-up configuration TE_C, the switching assistance circuit 50 is arranged on the voltage side $V_{pa}$, that is, connected to the first switching bridge 30, between the respective first midpoints 38.

For the high step-up configuration TE_C, between the time instants $t_5$ and T (or t0), according to the example of the embodiment of the switching assistance circuit 50, the inductor 70 or even the additional piezoelectric element 78 sees its $I_{CALC}$ current decrease, this under the voltage $V_{pa}$ equal to $-V_{in}$. At the time instant T (or $t_0$), the $I_{CALC}$ current is negative.

Just before the time instant t0, the total piezoelectric voltage $V_p$ is equal to $V_{out}-V_{in}$, the voltage $V_{pa}$ being equal to $-V_{in}$ and the voltage $V_{pb}$ being equal to $V_{out}$; and the switches $K_5$, $K_8$, $K_1$, $K_4$ are closed.

At the time instant $t_0$, all the switches that were closed, open. The $I_{CALC}$ current then charges the parasitic capacitances of the switches $K_5$, $K_8$, while it discharges the parasitic capacitances of the switches $K_6$, $K_7$. Similarly, through the piezoelectric assemblies 12 the voltage of which evolves slowly, the $I_{CALC}$ current partially charges the parasitic capacitances of the switches $K_1$, $K_4$. The voltage $V_{pa}$ thus evolves from $-V_{in}$ to $+V_{in}$, whereas the voltage $V_{pb}$ evolves substantially from $V_{out}$ to $V_{out}-2V_{in}$ plus the evolution of the total piezoelectric voltage $V_p$ since the time instant $t_0$.

The voltage inversion $V_{pa}$ is considered completed before the total piezoelectric voltage $V_p$ reaches the next step $V_b$. Indeed, even if the amplitude of the $I_{CALC}$ current in the switching assistance circuit 50 is much smaller than the amplitude of the internal current $I_L$ of the piezoelectric elements 15 (for example, at least 3 times smaller to limit its size), this one nevertheless only has to charge/discharge the parasitic capacitances of the switches 36, 46 considered to be much smaller than the reference capacitance $C_0$ of the piezoelectric elements 15 (at least a factor of 3). Furthermore, the $I_{CALC}$ current in the switching assistance circuit 50 approaches its minimum value (its negative extremum) at time instant $t_0$, while the internal current $I_L$ approaches 0 at said time instant $t_0$.

Once the complete inversion of the voltage $V_{pa}$ is reached (transition from $-V_{in}$ to $+V_{in}$), then the switches $K_6$ and $K_7$ are closed so as to fix the voltage $V_{pa}$, whereas the voltage $V_{pb}$ continues its progression to 0 under the effect of the natural decrease of the total piezoelectric voltage $V_p$.

The remainder of the conversion cycle of the convener 10 according to the complementary feature remains substantially unchanged from the conversion cycle of the converter 10 of FIG. 3.

The voltage excursion of the total piezoelectric voltage $V_{in}$ is thus limited between the time instants t5 and t1, with the latter going from $V_{out}-V_{in}$ to $V_{in}$, instead of going from $+V_{in}+V_{out}$ to $V_{in}$ with the converter 10 of FIG. 3 (in the case of the high step-up configuration TE, to ensure zero-voltage switching of the switches 36, 46), that is, an excursion of $V_{out-2}$ $V_{in}$ instead of $V_{out}$, while ensuring zero-voltage switching of the switches 36, 46.

As an optional addition, when the converter 10 comprises two switching assistance circuits 50, with the first switching assistance circuit connected to the first switching bridge and the second switching assistance circuit connected to the second switching bridge 40, the switching assistance circuits 50 then being arranged on both the $V_{pa}$ voltage side and the Vpb voltage side, the effects of the two switching assistance circuits 50 add up. It is only necessary to choose the switching assistance circuits 50 according to the presence or not of a DC component, and possibly according to the sign of this DC component if there is one.

Thus, it is conceivable that the electrical energy convener 10 according to this additional aspect provides even further improved control by the switching assistance circuit 50.

The invention claimed is:

1. An electrical energy converter to convert an input voltage to at least one output voltage, the electrical energy converter comprising:

at least one pair of first and second piezoelectric assemblies, each piezoelectric assembly including at least one piezoelectric element, a first switching bridge including two first switching branches, each first switching branch including at least one first switch;

at least one second switching bridge including two second switching branches, each second switching branch including at least one second switch;

each piezoelectric assembly including a first end connected to the first switching bridge and a second end connected to the second switching bridge;

each first switch being connected between an input voltage application terminal and a respective first end;

each second switch being connected between an output voltage supply terminal and a respective second end; and at least one complementary switch connected directly between the ends of a respective pair of first and second piezoelectric assemblies, said ends being connected directly to each other via a respective complementary switch being connected to a same respective switching bridge, each complementary switch being connected only to the ends of the respective pair of first and second piezoelectric assemblies.

2. The electrical energy converter according to claim 1, wherein the converter comprises two complementary switches, a first complementary switch being connected directly between first ends of a respective pair of first and second piezoelectric assemblies, said first ends being connected to the first switching bridge, and a second complementary switch being connected directly between second ends of a respective pair of first and second piezoelectric assemblies, said second ends being connected to the second switching bridge.

3. The electrical energy converter according to claim 1, wherein the converter is devoid of a direct connection between each complementary switch and a respective input voltage application terminal, and devoid of a direct connection between each complementary switch and a respective output voltage supply terminal.

4. The electrical energy converter according to claim 1, wherein the electrical energy converter is able to convert the input voltage into a plurality of distinct output voltages, and comprises for each respective output voltage:

a respective second switching bridge;

a respective pair of first and second piezoelectric assemblies.

5. The electrical energy converter according to claim 1, further comprising at least one switching assistance circuit, each switching assistance circuit being connected between ends of a respective pair of first and second piezoelectric assemblies, said ends linked together via a respective switching assistance circuit being connected to a same respective switching bridge, each switching assistance circuit being configured to discharge a parasitic capacitance of a switch of the respective switching bridge to which it is connected, via the flow of a previously received current, and to charge a parasitic capacitance of another switch of said switching bridge, respectively.

6. The electrical energy converter according to claim 5, wherein the at least one switching assistance circuit comprises two switching assistance circuits, a first switching assistance circuit being connected the first ends of a respective pair of first and second piezoelectric assemblies, said first ends being connected to the first switching bridge, and a second switching assistance circuit being connected between the second ends of a respective pair of first and second piezoelectric assemblies, said second ends being connected to the second switching bridge.

7. The electrical energy converter according to claim 5, wherein each switching assistance circuit includes an element selected from among the group consisting of: an inductor, a first set of an inductor and a diode connected in series; a second set of an inductor and a capacitor connected in series; and an additional piezoelectric element.

8. The electrical energy converter according to claim 7, wherein each switching assistance circuit is constituted of an element selected from among the group consisting of: an inductor, a first set of an inductor and a diode connected in series; a second set of an inductor and a capacitor connected in series; and an additional piezoelectric element.

9. The electrical energy converter according to claim 1, wherein each piezoelectric assembly is constituted according to one of the constitutions among the group consisting of: a single piezoelectric element; a plurality of piezoelectric elements connected in series; a plurality of piezoelectric elements connected in parallel; and an arrangement of a plurality of parallel piezoelectric branches, each branch including one or more piezoelectric elements connected in series.

10. The electrical energy converter according to claim 1, wherein each first switching branch is connected between two input voltage application terminals and includes at least two first switches connected in series and connected together at a first midpoint, each first midpoint then being connected to a respective first end.

11. The electrical energy converter according to claim 1, wherein each second switching branch is connected between two respective output voltage supply terminals and includes at least two second switches connected in series and connected together at a second midpoint, each second midpoint then being connected to a respective second end.

12. An electronic electrical energy conversion system comprising:

the electrical energy converter according to claim 1; and an electronic device for controlling the electrical energy converter.

13. The electronic electrical energy conversion system according to claim 12, wherein the electronic control device is configured to control, during a respective resonance cycle of the first and second piezoelectric assemblies, a switching of each of the first and second switches to alternate substantially constant voltage phases at the terminals of the fit and second piezoelectric assemblies and substantially constant load phases at said first and second piezoelectric assemblies.

14. The electronic electrical energy conversion system according to claim 13, wherein the electronic control device is further configured to, during at least one substantially constant voltage phase, control at least one respective complementary switch to the closed position.

15. The electronic electrical energy conversion system according to claim 13, wherein the electronic control device is configured to, during each substantially constant load phase, simultaneously control to the closed position at most one respective switch among the first and second switches connected directly to the first piezoelectric assembly and at most one respective switch among the first and second switches connected directly to the second piezoelectric assembly, and in the open position all the first and second switches of the first and second switching branches except the at most one respective switch among the first and second switches connected directly to the first piezoelectric assembly and the at most one respective switch among the first and second switches connected directly to the second piezoelectric assembly.

16. The electronic electrical energy conversion system according to claim 15, wherein the electronic control device is further configured to, during at least one substantially constant voltage phase, control at least one respective complementary switch in the closed position; and wherein, in the absence of controlling a respective complementary switch in the closed position during a respective substantially constant voltage phase, a value of the voltage during the substantially constant voltage phase is selected from among a group of values consisting of: a difference between a value of the input voltage and a value of the output voltage; a difference between the value of the output voltage and the value of the input voltage; a sum of the value of the input voltage and the value of the output voltage; and in opposite of the sum of the value of the input voltage and the value of the output voltage; and with the control of at least one respective complementary switch in the closed position during a respective substantially constant voltage phase, said group of values further includes: the value of the input voltage; opposite of the value of the input voltage; the value of the output voltage; an opposite of the value of the output voltage; and zero value.

17. The electronic electrical energy conversion system according to claim 16, wherein said group of values includes the value of the input voltage and the opposite of the value of the input voltage if the electrical energy converter comprises a respective complementary switch connected directly between the second ends of a respective pair of first and second piezoelectric assemblies, said second ends being connected to the second switching bridge;

said group of values includes the value of the output voltage and the opposite of the value of the output voltage if the electrical energy converter comprises a respective complementary switch connected directly between the first ends of a respective pair of first and second piezoelectric assemblies, said first ends being connected to the first switching bridge.

18. The electronic electrical energy conversion system according to claim 12, wherein the electronic electrical energy conversion system is a system for converting to DC electrical energy, such as a DC-DC conversion system or an AC-DC conversion system.

19. A method for controlling the electrical energy converter according to claim 1, the method being implemented by an electronic control device and comprising the control, during a respective resonance cycle of the first and second piezoelectric assemblies, of a switching of each of the first and second switches to alternate phases of substantially constant voltage at the terminals of the first and second piezoelectric assemblies and phases of substantially constant load at said terminals of the first and second piezoelectric assemblies, wherein, during at least one substantially constant voltage phase, at least one respective complementary switch is controlled to the closed position.

20. The method according to claim 19, wherein during each substantially constant load phase, at most one respective switch from among the first and second switches connected directly to the first piezoelectric assembly and at most one respective switch from among the first and second switches connected directly to the second piezoelectric assembly are controlled to the closed position at the same time, and all the first and second switches of the first and second switching branches except the at most one respective switch among the first and second switches connected directly to the first piezoelectric assembly and the at most one respective switch among the first and second switches connected directly to the second piezoelectric assembly are controlled to the open position.

* * * * *